(12) United States Patent
Kim et al.

(10) Patent No.: US 10,580,845 B2
(45) Date of Patent: Mar. 3, 2020

(54) DISPLAY DEVICE HAVING DIFFERENTLY SIZED REGIONS CAPABLE OF UNIFORM LUMINANCE

(71) Applicant: Samsung Display Co., Ltd., Yongin-si, Gyeonggi-do (KR)

(72) Inventors: Yang Wan Kim, Yongin-si (KR); Hyung Jun Park, Yongin-si (KR); Jae Yong Lee, Yongin-si (KR); Byung Sun Kim, Yongin-si (KR); Su Jin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 61 days.

(21) Appl. No.: 15/818,476

(22) Filed: Nov. 20, 2017

(65) Prior Publication Data
US 2018/0151663 A1    May 31, 2018

(30) Foreign Application Priority Data

Nov. 29, 2016 (KR) .................. 10-2016-0160823

(51) Int. Cl.
*H01L 27/32* (2006.01)
*G09G 3/32* (2016.01)
(Continued)

(52) U.S. Cl.
CPC ........... *H01L 27/3276* (2013.01); *G09G 3/32* (2013.01); *H01L 27/124* (2013.01);
(Continued)

(58) Field of Classification Search
CPC ............ H01L 27/3276; H01L 27/3279; H01L 27/3223; H01L 27/124; G09G 2320/0223; G09G 2300/0413
See application file for complete search history.

(56) References Cited

U.S. PATENT DOCUMENTS

| | | | |
|---|---|---|---|
| 10,229,964 B2 * | 3/2019 | Kim | .................... H01L 27/3276 |
| 2010/0020059 A1 * | 1/2010 | Suh | ...................... G09G 3/3233 345/212 |

(Continued)

FOREIGN PATENT DOCUMENTS

| | | |
|---|---|---|
| EP | 2085952 A1 | 8/2009 |
| EP | 3264405 A2 | 1/2018 |

(Continued)

OTHER PUBLICATIONS

EPO Extended Search Report dated Jun. 27, 2018, corresponding to European Patent Application No. 18157710.7 (7 pages).

*Primary Examiner* — Nduka E Ojeh
(74) *Attorney, Agent, or Firm* — Lewis Roca Rothgerber Christie LLP

(57) ABSTRACT

A display device includes a substrate including a first pixel region, a second pixel region connected to the first pixel region and having a smaller area than the first pixel region, and a peripheral region surrounding the first and second pixel regions, a first pixel in the first pixel region, a second pixel in the second pixel region, a first line connected to the first pixel, a second line connected to the second pixel, an extending line extending to the peripheral region and connected to any one of the first and second lines, a dummy part overlapping with the extending line for compensating a difference between load values of the first and second lines, a first power line in the peripheral region, and a conductive pattern overlapping with at least one region of the dummy part, and electrically connected to the first power line.

27 Claims, 19 Drawing Sheets

(51) Int. Cl.
*H01L 27/12* (2006.01)
*H01L 51/52* (2006.01)
*H01L 51/00* (2006.01)
*H01L 35/24* (2006.01)
*H01L 29/08* (2006.01)

(52) U.S. Cl.
CPC ...... *H01L 27/1222* (2013.01); *H01L 27/3223* (2013.01); *H01L 27/3248* (2013.01); *H01L 27/3258* (2013.01); *H01L 27/3262* (2013.01); *H01L 27/3265* (2013.01); *H01L 27/3279* (2013.01); *H01L 51/5253* (2013.01); *G09G 2300/0413* (2013.01); *G09G 2320/0223* (2013.01)

(56) References Cited

U.S. PATENT DOCUMENTS

| | | | |
|---|---|---|---|
| 2016/0019856 A1* | 1/2016 | Tanaka | G09G 3/3648 345/206 |
| 2016/0027380 A1* | 1/2016 | Kim | G09G 3/3258 315/172 |
| 2016/0240141 A1 | 8/2016 | Lee et al. | |
| 2017/0249896 A1 | 8/2017 | Kim et al. | |
| 2018/0005585 A1* | 1/2018 | Kim | G09G 3/3258 |
| 2018/0082630 A1 | 3/2018 | Kim et al. | |
| 2018/0090061 A1 | 3/2018 | Kim et al. | |
| 2018/0151663 A1 | 5/2018 | Kim et al. | |
| 2019/0035876 A1* | 1/2019 | Kim | H01L 27/3223 |

FOREIGN PATENT DOCUMENTS

| KR | 10-2016-0099770 A | 8/2016 |
|---|---|---|
| KR | 10-2018-0003747 | 1/2018 |

\* cited by examiner

DISPLAY DEVICE HAVING DIFFERENTLY SIZED REGIONS CAPABLE OF UNIFORM LUMINANCE

CROSS-REFERENCE TO RELATED APPLICATION

The present application claims priority to, and the benefit of, Korean Patent Application No. 10-2016-0160823, filed on Nov. 29, 2016, in the Korean Intellectual Property Office, the entire disclosure of which is incorporated by reference herein.

BACKGROUND

1. Field

An aspect of the present disclosure relates to a display device.

2. Description of the Related Art

A display device includes a plurality of pixels, each including a display element, lines, and a plurality of transistors connected to the lines, the plurality of transistors for driving the display element.

The lines may have different load values according to their lengths, and a pixel region in which the pixels are located may have a size that depends on its position due to a process margin. In a final image provided from the display device, a difference in luminance may be caused by a difference between respective load values.

SUMMARY

Embodiments provide a display device having uniform luminance.

Embodiments also provide a display device having improved reliability.

According to an aspect of the present disclosure, there is provided a display device including a substrate including a first pixel region, a second pixel region connected to the first pixel region and having a smaller area than the first pixel region, and a peripheral region surrounding the first pixel region and the second pixel region, a first pixel in the first pixel region, a second pixel in the second pixel region, a first line electrically connected to the first pixel, a second line electrically connected to the second pixel, an extending line extending to the peripheral region and connected to any one of the first line and the second line, a dummy part overlapping with the extending line, and for compensating a difference between a load value of the first line and a load value of the second line, a first power line in the peripheral region, and a conductive pattern overlapping with at least one region of the dummy part, and electrically connected to the first power line.

The dummy part may include an eighth active pattern on the substrate, an insulating layer over the eighth active pattern, and defining a fourteenth contact hole through which a portion of the eighth active pattern is exposed, the extending line on the insulating layer, and a fourth contact line above the extending line, connected to the eighth active pattern through the fourteenth contact hole, and connected to the conductive pattern.

A fixed first voltage may be applied to the first power line, and a voltage having the same level as the fixed first voltage is applied to the conductive pattern and the fourth contact line.

The display device may further include a protective layer defining a fifteenth contact hole between the fourth contact line and the conductive pattern and exposing a portion of the fourth contact line therethrough, and a thirteenth contact hole exposing a portion of the first power line therethrough.

A first end of the conductive pattern may be connected to the fourth contact line through the fifteenth contact hole, and a second end of the conductive pattern may be connected to the first power line through the thirteenth contact hole.

The first power line may include a first metal layer in the same layer as the fourth contact line, and a second metal layer on the first metal layer, and the display device further may include an interlayer insulating layer defining a twelfth contact hole between the first and second metal layers and exposing a portion of the first metal layer therethrough, and a fifteenth contact hole exposing a portion of the fourth contact line therethrough, and the second metal layer may be electrically connected to the first metal layer through the twelfth contact hole.

The display device may further include a bridge pattern between the fourth contact line and the conductive pattern, and a protective layer defining a sixteenth contact hole between the bridge pattern and the conductive pattern and exposing a portion of the bridge pattern therethrough, and a thirteenth contact hole exposing a portion of the second metal layer therethrough.

A first end of the conductive pattern may be connected to the bridge pattern through the sixteenth contact hole, and a second end of the conductive pattern may be connected to the second metal layer through the thirteenth contact hole.

The sixteenth contact hole may be in the protective layer to overlap with the fourteenth contact hole when viewed on a plane.

The thirteenth contact hole is in the protective layer to overlap with the twelfth contact hole when viewed on a plane.

The first line may be a first scan line extending along a first direction on the substrate for providing a scan signal to the first pixel, and the second line may be a second scan line extending along the first direction for providing a scan signal to the second pixel.

The second scan line may extend to the peripheral region to be connected to the extending line.

The extending line may be integrally formed with the second scan line.

A length of the first line may be longer than that of the second line.

The display device may further include a first light emitting control line connected to the first pixel, and a second light emitting control line connected to the second pixel.

The second light emitting control line may extend to the peripheral region to be connected to the extending line.

The display device may further include a data line in the first pixel region and in the second pixel region, and extending along a second direction crossing the first direction on the substrate, and a second power line spaced from the data line for receiving a fixed second voltage having a different level from a fixed first voltage.

The display device may further include a third contact line between the dummy part and the second pixel in the peripheral region when viewed on a plane.

The third contact line may extend from the second power line to be integrally formed with the second power line.

The third contact line and the dummy part may be electrically separated from each other.

The second pixel may include a transistor connected to the scan line, the data line, and the second power line, the transistor including a seventh active pattern on the substrate, a gate electrode on the seventh active pattern with a gate insulating layer interposed therebetween, and source and drain electrodes each connected to the seventh active pattern.

The seventh active pattern may be in the same layer as the eighth active pattern of the dummy part.

The display device may further include a light emitting device connected to the transistor and including an anode electrode connected to the transistor, an emitting layer on the anode electrode, and a cathode electrode on the emitting layer.

The conductive pattern may be in the same layer as the anode electrode.

The peripheral region may include a first peripheral region at the periphery of the first pixel region, a second peripheral region at the periphery of the second pixel region, and an additional peripheral region adjacent the first pixel region and the second peripheral region.

The dummy part may be in the second peripheral region.

The substrate may further include a third pixel region spaced from the second pixel region and connected to the first pixel region, and a third peripheral region surrounding the third pixel region.

The dummy part may be in the third peripheral region.

The display device may further include a third pixel in the third pixel region, and a third scan line for providing a scan signal to the third pixel and connected to the extending line.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
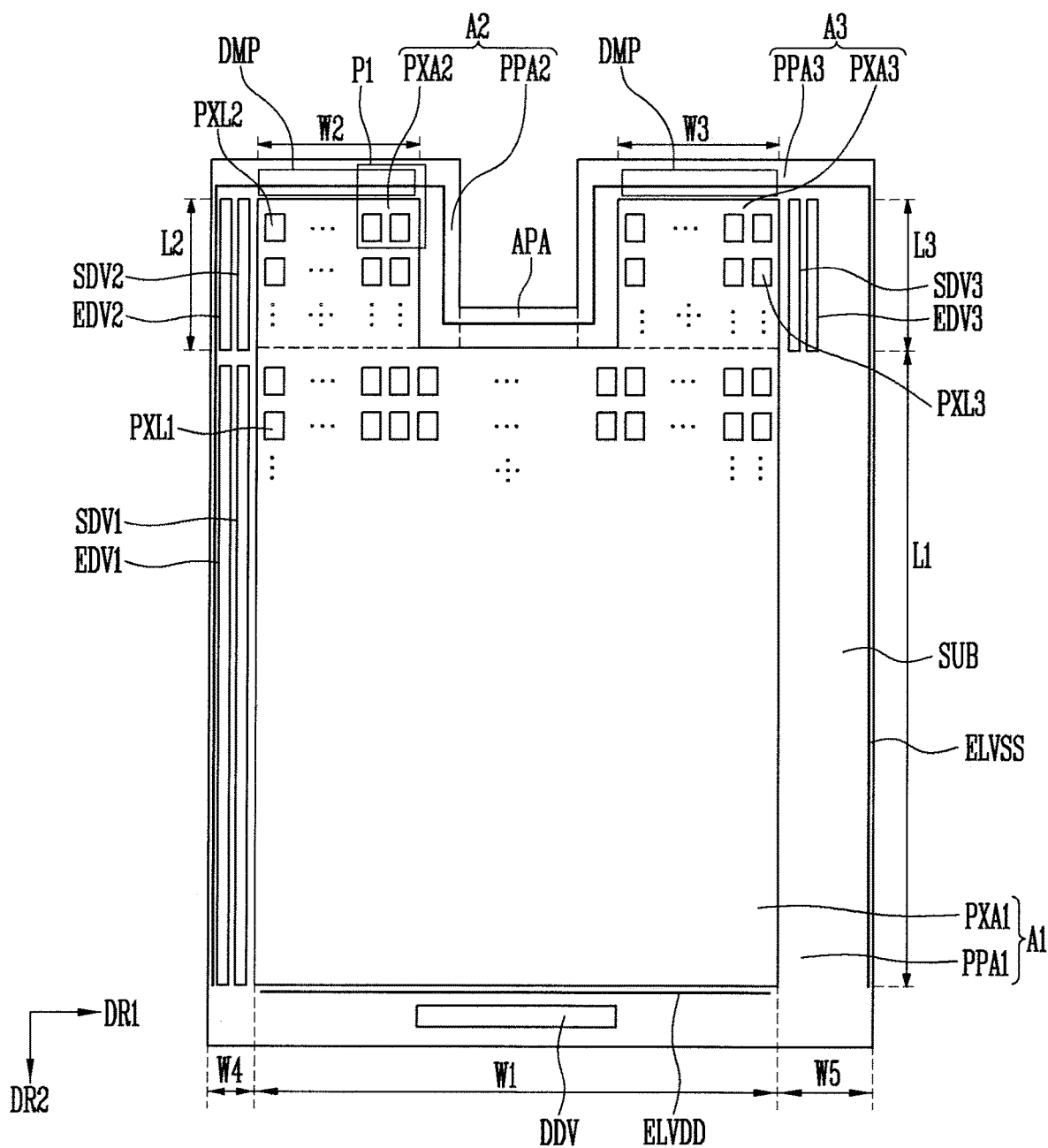
FIGS. 1 and 2 are plan views illustrating a display device according to an embodiment of the present disclosure.

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention. Additionally, in the claims, a fourth component does not necessarily indicate the existence of three or more other components (i.e., does not necessarily indicate the existence of first, second, and third components).

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
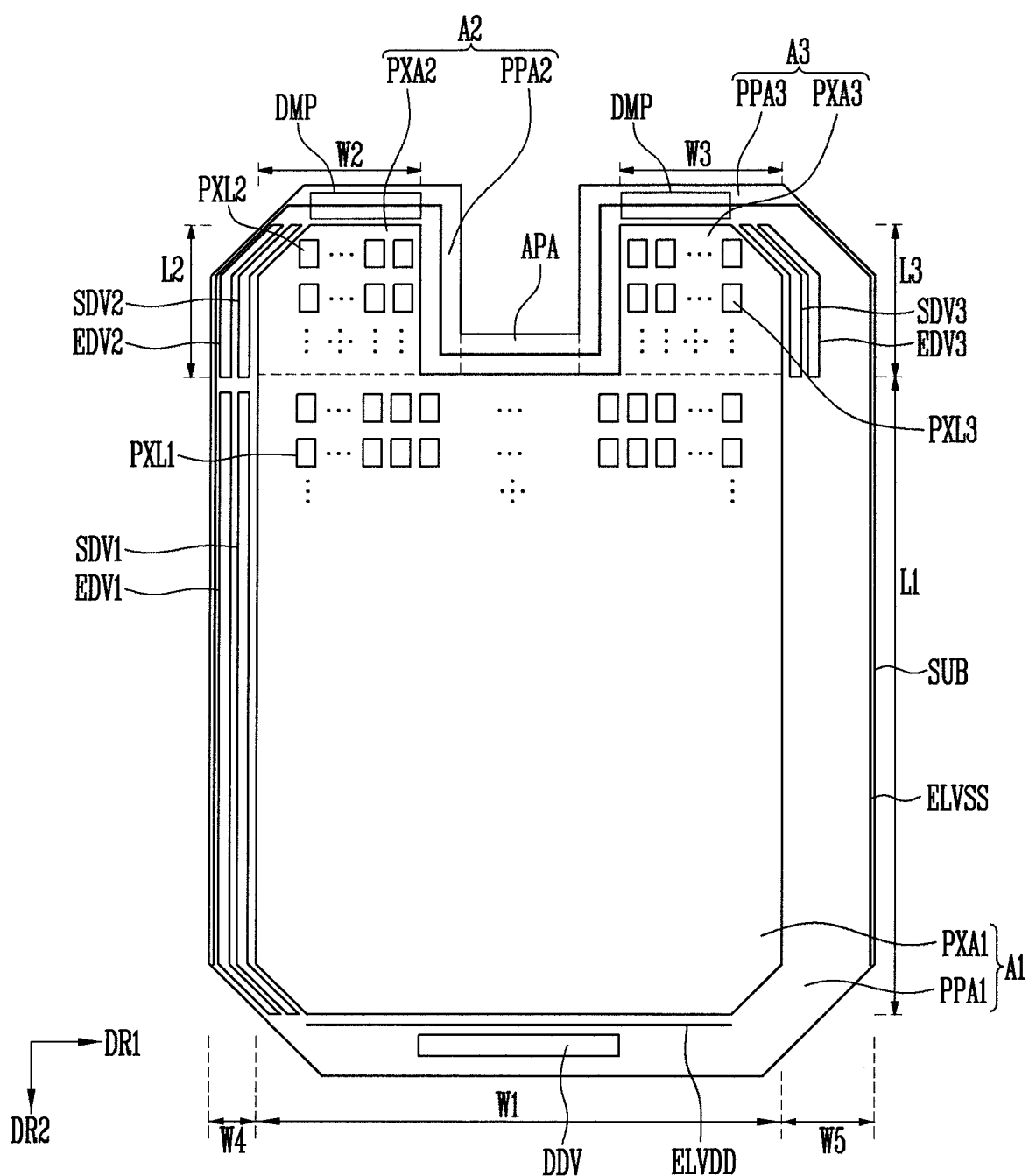

FIGS. 1 and 2 are plan views illustrating a display device according to an embodiment of the present disclosure.

Referring to FIGS. 1 and 2, the display device according to the embodiment of the present disclosure may include a substrate SUB, pixels PXL1, PXL2, and PXL3 (hereinafter, referred to as 'PXL'), a driver/drive unit that is provided on the substrate SUB and drives the pixels PXL, a power supply that supplies power to the pixels PXL, and a line unit (e.g., data lines, scan lines, and/or light emitting control lines) that connects the pixels PXL to the driver.

The substrate SUB includes a plurality of regions, and at least two of the regions may have different areas. As an example, the substrate SUB may have two regions, and the two regions may have areas that are different from each other. As another example, the substrate SUB may have three regions. In this case, either all of the three regions may have areas that are different from one another, or only two regions of the three regions may have areas that are different from each other. As still another example, the substrate SUB may have four or more regions.

In the present embodiment, the substrate SUB includes three regions (i.e., first to third regions A1, A2, and A3), and is illustrated as an example. The first to third regions A1, A2, and A3 may have various shapes. For example, the first to third regions A1, A2, and A3 may be provided in various shapes, such as a closed-shape polygon including linear sides, a circle, an ellipse, etc., including curved sides, and a semicircle, a semi-ellipse, etc., including linear and curved sides.

Each of the first to third regions A1, A2, and A3 may have an approximately rectangular shape. In addition, in the first to third regions A1, A2, and A3, at least some of the corners of each shape may have a shape of which width decreases as it becomes more distant from a boundary between the first region A1 and the second and third regions A2 and A3. For example, in the first region A1, a portion at which sides of adjacent straight lines meet each other may be replaced by an inclined diagonal line at the boundary between the second and third regions A2 and A3 and the first region A1. That is, a vertex portion of the rectangular shape may be configured as a linear side of which both adjacent ends are connected to sides of two straight lines adjacent to each other, the linear side having a predetermined inclination at the boundary between the second and third regions A2 and A3 and the first region A1.

The inclination of the diagonal line may be differently set depending on a position of the diagonal line. For example, the inclination of the diagonal line may be changed depending on a position at which the diagonal line is started, a length of the diagonal line, and the like. In the second region A2 and/or the third region A3, a portion at which adjacent sides meet each other may be replaced by a diagonal line having a predetermined inclination. In addition, a portion at which adjacent sides meet each other may be replaced by a diagonal line having a predetermined inclination even at a boundary at which the first to third regions A1, A2, and A3 meet one another.

The first to third regions A1, A2, and A3 may respectively include pixel regions PXA1, PXA2, and PXA3 (hereinafter, referred to as 'PXA') and peripheral regions PPA1, PPA2, and PPA3 (hereinafter, referred to as 'PPA'). The pixel regions PXA are regions in which pixels PXL for displaying an image are provided. Each pixel PXL will be described later.

The first to third pixel regions PXA1, PXA2, and PXA3 may roughly have shapes corresponding to those of the first to third regions A1, A2, and A3, respectively.

The peripheral regions PPA are regions in which the pixels PXL are not provided, and no image is displayed in the peripheral regions PPA. The driver for driving the pixels PXL, the power supply for supplying power to the pixels PXL, and some lines for connecting the pixels PXL to the driver may be provided in the peripheral regions PPA. The peripheral regions PPA correspond to a bezel in a final display device, and widths of the bezel may be determined based on widths of the peripheral regions PPA.

Each of the first to third regions A1, A2, and A3 will be described as follows. The first region A1 may have a largest area among the first to third areas A1, A2, and A3. The first region A1 may include a first pixel region PXA1 in which an image is displayed, and a first peripheral region PPA1 surrounding at least one portion of the first pixel region PXA1.

The first pixel region PXA1 may be provided in a shape corresponding to that of the first region A1. The first pixel region PXA1 may have a first width W1 in a first direction DR1, and may have a first length L1 in a second direction DR2 that crosses the first direction DR1.

The first peripheral region PPA1 may be provided at at least one side of the first pixel region PXA1. The first peripheral region PPA1 may surround the circumference of the first pixel region PXA1, but may be provided at a portion not including portions at which the second region A2 and the third region A3 are located. The first peripheral region PPA1 may include a lateral part extending in the first direction DR1, and a longitudinal part extending in the second direction DR2. The longitudinal part of the first peripheral region PPA1 may be provided as a pair of parts spaced apart from each other along the first direction DR1 with the first pixel region PXA1 interposed therebetween.

The second region A2 may have a smaller area than that of the first region A1. The second region A2 may include a second pixel region PXA2 in which an image is displayed, and a second peripheral region PPA2 surrounding at least one portion of the second pixel region PXA2.

The second pixel region PXA2 may be provided in a shape corresponding to that of the second region A2. The second pixel region PXA2 may have a second width W2 that is smaller than the first width W1 of the first region A1. The second pixel region PXA2 may have a second length L2 that is smaller than the first length L1 of the first region A1. The second pixel region PXA2 is provided in a shape extending from the first pixel region PXA1, and may be directly connected to the first pixel region PXA1. In other words, one side of the second pixel region PXA2 may be in contact with one side of the first pixel region PXA1.

The second peripheral region PPA2 may be provided at at least one side of the second pixel region PXA2. The second peripheral region PPA2 surrounds the second pixel region PXA2, but might be omitted from a portion at which the first pixel region PXA1 and the second pixel region PXA2 are connected to each other. The second peripheral region PPA2 may also include a lateral part extending in the first direction DR1, and a longitudinal part extending in the second direction DR2. The longitudinal part of the second peripheral region PPA2 may be provided as a pair of longitudinal parts that are spaced apart from each other along the first direction DR1 with the second pixel region PXA2 interposed therebetween.

The third region A3 may have a smaller area than that of the first region A1. For example, the third region A3 may have the same area as that of the second region A2. The third region A3 may include a third pixel region PXA3 in which an image is displayed, and a third peripheral region PPA3 partially surrounding the third pixel region PXA3.

The third pixel region PXA3 may be provided in a shape corresponding to that of the third region A3. The third pixel region PXA3 may have a third width W3 that is smaller than the first width W1 of the first region A1. The third pixel region PXA3 may have a third length L3 that is smaller than the first length L1 of the first region A1. The second width W2 and the third width W3 may be equal to each other. In addition, the second length L2 and the third length L3 may be equal to each other.

The third pixel region PXA3 extends from the first pixel region PXA1, and may be directly connected to the first pixel region PXA1. In other words, one side of the third pixel region PXA3 may be in contact with one side of the first pixel region PXA1.

The third peripheral region PPA3 may be provided at at least one side of the third pixel region PXA3. The third peripheral region PPA3 surrounds the third pixel region PXA3, but may be omitted from a portion at which the first pixel region PXA1 and the third pixel region PXA3 are connected to each other. The third peripheral region PPA3 may also include a lateral part extending in the first direction DR1, and a longitudinal part extending in the second direction DR2. The longitudinal part of the third peripheral region PPA3 may be provided as a pair of longitudinal parts spaced apart from each other along the first direction with the third pixel region PXA3 interposed therebetween.

With respect to a virtual center line extending along the second direction DR2 and located at a middle point of the lateral part of the first peripheral region PPA1 of the first region A1, the third region A3 may have a shape that is linearly symmetric to the second region A2. In the present embodiment, the arrangement of components provided in the third region A3 may be substantially identical to that in the second region A2, with the exception of some lines.

Therefore, the substrate SUB may have a shape in which the second region A2 and the third region A3 extend from the first region A1 in the second direction DR2. In addition, because the second region A2 and the third region A3 are spaced apart from each other, the substrate SUB may have a shape in which it is depressed between the second region A2 and the third region A3 (e.g., the substrate SUB may have a cutout portion between the second region A2 and the third region A3). That is, the substrate SUB may have a notch between the second region A2 and the third region A3.

The longitudinal parts of the first peripheral region PPA1 may be respectively connected to some of the longitudinal parts of the second peripheral region PPA2 and the third peripheral region PPA3. For example, a left longitudinal part of the first peripheral region PPA1 may be connected to a left longitudinal part of the second peripheral region PPA2. In addition, the left longitudinal part of the first peripheral region PPA1 and the left longitudinal part of the second peripheral region PPA2 may have the same width W4 (hereinafter, referred to as a fourth width W4). A right longitudinal part of the first peripheral region PPA1 may be connected to a right longitudinal part of the third peripheral region PPA3. In addition, the right longitudinal part of the first peripheral region PPA1 and the right longitudinal part of the third peripheral region PPA3 may have the same width W5 (hereinafter, referred to as a fifth width W5).

The fourth width W4 may be different from the fifth width W5. For example, the fourth width W4 may be smaller than the fifth width W5.

The substrate SUB may further include an additional peripheral region APA. The additional peripheral region APA may be provided adjacent to the first pixel region PXA1, the second peripheral region PPA2, and the third peripheral region PPA3. For example, the additional peripheral region APA may connect the second peripheral region PPA2 and the third peripheral region PPA3. For example, the additional peripheral region APA may connect a right longitudinal part of the second peripheral region PPA2 and a left longitudinal part of the third peripheral region PPA3. That is, the additional peripheral region APA may be provided at a side of the first pixel region PXA1 between the second region A2 and the third region A3.

The pixels PXL may be provided in the pixel regions PXA (e.g., in the first to third pixel regions PXA1, PXA2, and PXA3) on the substrate SUB. Each pixel PXL is a minimum unit for displaying an image, and a plurality of pixels PXL may be provided in the first to third pixel regions PXA1, PXA2, and PXA3. The pixels PXL may include a display element that emits light. For example, the display element may be any one of a liquid crystal display (LCD) element, an electrophoretic display (EPD) element, an electrowetting display (EWD) element, and an organic light emitting display (OLED) element. Meanwhile, for convenience of description, a case where the display element is an OLED element will be illustrated below as an example.

Each of the pixels PXL may emit light of one of red, green, and blue, but the present disclosure is not limited thereto. For example, each of the pixels PXL may emit light of a color such as cyan, magenta, yellow, or white.

The pixels PXL may include first pixels PXL1 arranged in the first pixel region PXA1, second pixels PXL2 arranged in the second pixel region PXA2, and third pixels PXL3 arranged in the third pixel region PXA3. In an embodiment of the present disclosure, each of the first to third pixels PXL1, PXL2, and PXL3 may be provided in plurality to be arranged in a matrix form along rows extending in the first direction DR1 and columns extending in the second direction DR2. However, the arrangement of the first to third pixels PXL1, PXL2, and PXL3 is not particularly limited, and the first to third pixels PXL1, PXL2, and PXL3 may be arranged in various forms.

In the second region A2 and the third region A3, a number of the second pixels PXL2 and the third pixels PXL3 may be changed depending on rows. For example, in the second region A2 and the third region A3, a number of second pixels PXL2 and third pixels PXL3, which are located on a row corresponding to a corner configured as a diagonal side having the inclination, may be smaller than a number of second pixels PXL2 and third pixels PXL3 that are located on a row corresponding to a corner configured as a linear side. In addition, the number of second pixels PXL2 and third pixels PXL3, which are located on the row, may decrease as the length of the row becomes shorter. Therefore, lengths of lines connecting the second pixels PXL2 and the third pixels PXL3 may be shortened.

The driver provides a signal to each pixel PXL through respective lines (e.g., through the line unit), thereby controlling driving of each pixel PXL.

The driver may include scan drivers SDV1, SDV2, and SDV3 (hereinafter, referred to as scan drivers SDV) that provide a scan signal to each pixel PXL along a respective scan line, light emitting drivers EDV1, EDV2, and EDV3 (hereinafter, referred to as light emitting drivers EDV) that provide a light emitting control signal to each pixel PXL along a respective light emitting control line, a data driver DDV that provides a data signal to each pixel PXL along a respective data line, and a timing controller. The timing controller may control the scan drivers SDV, the light emitting drivers EDV, and the data driver DDV.

The first scan driver SDV1 may be located at the longitudinal part in the first peripheral region PPA1. Because the longitudinal parts of the first peripheral region PPA1 are spaced apart from each other along the width direction of the first pixel region PXA1, the first scan driver SDV1 may be located at at least one side of the longitudinal part of the first peripheral region PPA1. The first scan driver SDV1 may extend long along the length direction of the first peripheral region PPA1.

In a similar manner, the second scan driver SDV2 may be located in the second peripheral region PPA2, and the third scan driver SDV3 may be located in the third peripheral region PPA3.

In a manner similar to the first scan driver SDV1, the first light emitting driver EDV1 may also be located at the longitudinal part in the first peripheral region PPA1. The first light emitting driver EDV1 may be located at at least one side of the longitudinal part of the first peripheral region PPA1. The first light emitting driver EDV1 may extend long along the length direction of the first peripheral region PPA1 (e.g., in the second direction DR2).

In a similar manner, the second light emitting driver EDV2 may be located in the second peripheral region PPA2, and the third light emitting driver EDV3 may be located in the third peripheral region PPA3.

The data driver DDV may be located in the first peripheral region PPA1. Particularly, the data driver DDV may be located at the lateral part of the first peripheral region PPA1. The data driver DDV may extend long along the width direction of the first peripheral region PPA1 (e.g., in the first direction DR1).

The positions of the scan drivers SDV, the light emitting drivers EDV, and/or the data driver DDV may be changed in other embodiments.

The timing controller may be connected, in various manners, to the first to third scan drivers SDV1, SDV2, and SDV3, to the first to third light emitting drivers EDV1, EDV2, and EDV3, and to the data driver DDV through lines. The position at which the timing controller is located is not particularly limited. For example, the timing controller may be mounted on a printed circuit board to be connected to the first to third scan drivers SDV1, SDV2, and SDV3, the first to third light emitting drivers EDV1, EDV2, and EDV3, and the data driver DDV through a flexible printed circuit board. The printed circuit board may be located at various positions, such as at one side of the substrate SUB and at a back side of the substrate SUB.

The power supply may include at least one power supply line ELVDD and ELVSS. For example, the power supply may include a first power supply line ELVSS and a second power supply line ELVDD. The first power supply line ELVSS and the second power supply line ELVDD may supply power to the first pixel PXL1, the second pixel PXL2, and the third pixel PXL3.

One of the first power supply line ELVSS and the second power supply line ELVDD (e.g., the second power supply line ELVDD) may be located to at least correspond to one side of the first peripheral region PPA1, one side of the second peripheral region PPA2, or one side of the third peripheral region PPA3. For example, the second power supply line ELVDD may be located in a region in which the data driver DDV of the first peripheral region PPA1 is located. In addition, the second power supply line ELVDD may extend in the width direction of the first pixel region PXA1.

The other of the first power supply line ELVSS and the second power supply line ELVDD (e.g., the first power supply line ELVSS) may be located to partially surround the first pixel region PXA1, the second pixel region PXA2, and the third pixel region PXA3 excluding the region in which the data driver DDV of the first peripheral region PPA1 is located. For example, the first power supply line ELVSS may have a shape extending along the left and right longitudinal parts of the first peripheral region PPA1, the second peripheral region PPA2, the third peripheral region PPA3, and also along the additional peripheral region APA.

In the above, a case where the second power supply line ELVDD is located to correspond to one side of the first pixel region PXA1 in the first peripheral region PPA1, and where the first power supply line ELVSS is located in the other peripheral regions PPA, has been described as an example, but the present disclosure is not limited thereto.

A voltage applied to the second power supply line ELVDD may be higher than that applied to the first power supply line ELVSS.

Meanwhile, a length of a second scan line provided in the second pixel region PXA2 and a length of a third scan line provided in the third pixel region PXA3 are different from a length of a first scan line provided in the first pixel region PXA1. Similarly, a length of a second light emitting control line connected to the second pixel region PXA2 and a length of a third light emitting control line connected to the third pixel region PXA3 are different from a length of a first light emitting control line connected to the first pixel region PXA1. Differences between lines provided in each pixel region PXA may cause differences between load values for each pixel region PXA.

In an embodiment of the present disclosure, as a dummy part DMP is provided or is not provided in the peripheral region PPA corresponding to each pixel region PXA so as to compensate for the difference between load values for each pixel region PXA, structures having different parasitic capacitances may be provided. The dummy part DMP may be located in each of the second peripheral region PPA2 and the third peripheral region PPA, but the present disclosure is not limited thereto. The dummy part DMP will be described later with reference to FIG. 8.

Figure 3:
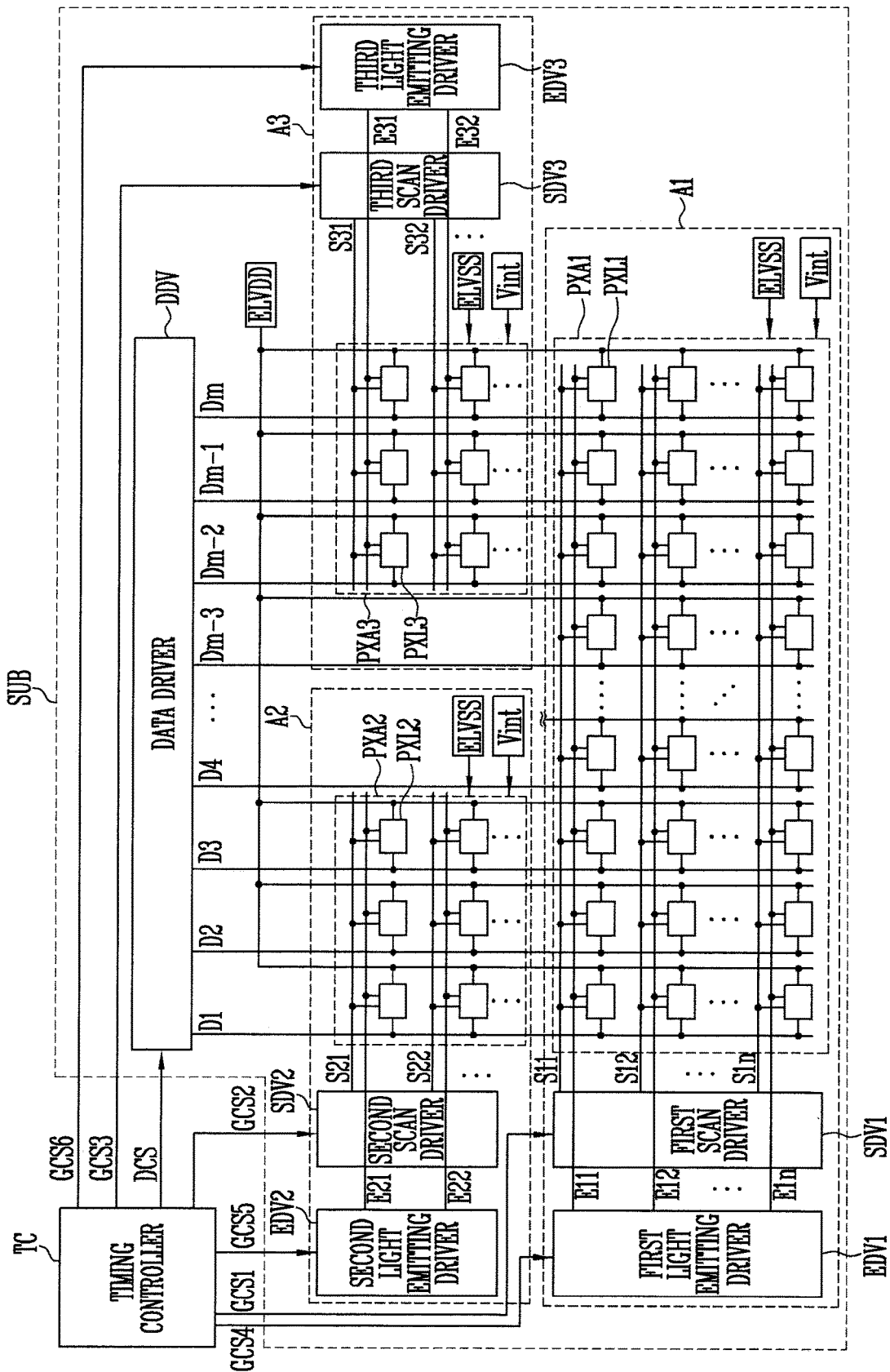
FIG. 3 is a block diagram illustrating an embodiment of pixels and a driver in the display device of FIG. 1.

FIG. 3 is a block diagram illustrating an embodiment of the pixels and the driver in the display device of FIG. 1. In FIG. 3, for convenience, ELVSS as a first power source uses the same reference numeral as the first power source line ELVSS of FIG. 1, and ELVDD as a second power source uses the same reference numeral as the second power supply line ELVDD of FIG. 1.

Referring to FIGS. 1 and 3, the display device according to the embodiment of the present disclosure may include pixels PXL, a driver, and a line unit (e.g., a plurality of signal lines).

The pixels PXL may include first to third pixels PXL1, PXL2, and PXL3, and the driver may include first to third scan drivers SDV1, SDV2, and SDV3, first to third light emitting drivers EDV1, EDV2, and EDV3, a data driver DDV, and a timing controller TC. In FIG. 3, positions of the first to third scan drivers SDV1, SDV2, and SDV3, the first to third light emitting drivers EDV1, EDV2, and EDV3, the data driver DDV, and the timing controller TC are set for convenience of description. When an actual display device is implemented, the first to third scan drivers SDV1, SDV2, and SDV3, the first to third light emitting drivers EDV1, EDV2, and EDV3, the data driver DDV, and the timing controller TC may be located at other positions in the display device. For example, the data driver DDV is located in a region closer to a second region A2 and a third region A3 than a first region A1, but the present disclosure is not limited thereto. For example, it will be apparent that the data driver DDV may be located in a region adjacent the first region A1.

The line unit provides signals of the driver to each pixel PXL, and may include scan lines, data lines D1 to Dm, light emitting control lines, a first power supply line (see ELVSS of FIG. 1), a second power supply line (see ELVDD of FIG. 1), and an initialization power line. The scan lines may include first scan lines S11 to S1$n$, second scan lines S21 and S22, and third scan lines S31 and S32 respectively connected to the first to third pixels PXL1, PXL2, and PXL3, and the light emitting control lines may include first to third light emitting control lines E11 to E1n, E21 and E22, and E31 and E32 respectively connected to the first to third pixels PXL1, PXL2, and PXL3. The data lines D1 to Dm and the first and second power lines ELVSS and ELVDD may be connected to the first to third pixels PXL1, PXL2, and PXL3.

The first pixels PXL1 are located in a first pixel region PXA1. The first pixels PXL1 may be connected to the first scan lines S11 to S1n, the first light emitting control lines E11 to E1n, and the data lines D1 to Dm. The first pixels PXL1 receive a data signal supplied from the data lines D1 to Dm when a scan signal is supplied from the first scan lines S11 to S1n. Each of the first pixels PXL1 supplied with the data signal may control the amount of current flowing from the second power source ELVDD applied to the second power supply line ELVDD to the first power source ELVSS via an organic light emitting device.

The second pixels PL2 are located in a second pixel region PXA2. The second pixels PXL2 are connected to the second scan lines S21 and S22, the second light emitting control lines E21 and E22, and the data lines D1 to D4. The second pixels PXL2 receive a data signal supplied from the data lines D1 to D4 when a scan signal is supplied from the second scan lines S21 and S22. Each of the second pixels PXL2 supplied with the data signal may control the amount of current flowing from the second power source ELVDD to the first power source ELVSS via the organic light emitting device.

The third pixels PXL3 are located in a third pixel region PXA3 defined by the third scan lines S31 and S32, the third light emitting control lines E31 and E32, and the data lines Dm-3 to Dm. The third pixels PXL3 receive a data signal supplied from the data lines Dm-3 to Dm when a scan signal is supplied from the third scan lines S31 and S32. Each of the third pixels PXL3 supplied with the data signal may control the amount of current flowing from the second power source ELVDD to the first power source ELVSS via the organic light emitting device.

The first scan driver SDV1 may supply a scan signal to the first scan lines S11 to S1n in response to a first gate control signal GCS1 from the timing controller TC. For example, the first scan driver SDV1 may sequentially supply the scan signal to the first scan lines S11 to S1n. If the scan signal is sequentially supplied to the first scan lines S11 to S1n, the first pixels PXL1 may be sequentially selected in units of horizontal lines.

The second scan driver SDV2 may supply a scan signal to the second scan lines S21 and S22 in response to a second gate control signal GCS2 from the timing controller TC. For example, the second scan driver SDV2 may sequentially supply the scan signal to the second scan lines S21 and S22. If the scan signal is sequentially supplied to the second scan lines S21 and S22, the second pixels PXL2 may be sequentially selected in units of horizontal lines.

The third scan driver SDV3 may supply a scan signal to the third scan lines S31 and S32 in response to a third gate control signal GCS3 from the timing controller TC. For example, the third scan driver SDV3 may sequentially supply the scan signal to the third scan lines S31 and S32. If the scan signal is sequentially supplied to the third scan lines S31 and S32, the third pixels PXL3 may be sequentially selected in units of horizontal lines.

The first light emitting driver EDV1 may supply a light emitting control signal to the first light emitting control lines E11 to E1n in response to a fourth gate control signal GCS4. For example, the first light emitting driver EDV1 may sequentially supply the light emitting control signal to the first light emitting control lines E11 to E1n.

Here, the light emitting control signal may be set to have a wider width than the scan signal. For example, a light emitting control signal supplied to an ith (i is a natural number) first light emitting control line E1i may be supplied to overlap with, for at least one period, a scan signal supplied to an (i−1)th first scan line S1i−1 and a scan signal supplied to an ith first scan line S1i.

The second light emitting driver EDV2 may supply a light emitting control signal to the second light emitting control lines E21 and E22 in response to a fifth gate control signal GCS5. For example, the second light emitting driver EDV2 may sequentially supply the light emitting control signal to the second light emitting control lines E21 and E22.

The third light emitting driver EDV3 may supply a light emitting control signal to the third light emitting control lines E31 and E32 in response to a sixth gate control signal GCS6. For example, the third light emitting driver EDV3 may sequentially supply the light emitting control signal to the third light emitting control lines E31 and E32.

Additionally, the light emitting control signal may be set to a gate-off voltage (e.g., a high voltage) such that transistors included in the pixels PXL can be turned off, and the scan signal may be set to a gate-on voltage (e.g., a low voltage) such that the transistors included in the pixels PXL can be turned on.

The data driver DDV may supply a data signal to the data lines D1 to Dm in response to a data control signal DCS. The data signal supplied to the data lines D1 to Dm may be supplied to pixels PXL selected by the scan signal.

The timing controller TC may supply, to the scan drivers SDV and the light emitting drivers EDV, the gate control signals GCS1 to GCS6 generated based on externally supplied timing signals. Also, the timing controller TC may supply the data control signal DCS to the data driver DDV.

A start pulse and clock signals may be included in each of the gate control signals GCS1 to GCS6. The start pulse may control a timing of a first scan signal or a first light emitting control signal. The clock signals may be used to shift the start pulse.

A source start pulse and clock signals may be included in the data control signal DCS. The source start pulse may control a sampling start time of data. The clock signals may be used to control a sampling operation.

As described above, in the display device according to the embodiment of the present disclosure, the pixels PXL may be provided in the regions A1, A2, and A3 having different areas. Lengths of the scan lines S11 to S1n, S21 and S22, and S31 and S32 and the light emitting control lines E11 to E1n, E21 and E22, and E31 and E32, which provide signals to the pixels PXL, may be changed depending on the regions A1, A2, and A3, specifically, areas of the pixel regions PXA1, PXA2, and PXA3. For example, the first width W1 (see FIG. 1) of the first pixel region PXA1 is longer than the second width W2 (see FIG. 2) of the second pixel region PXA2. Accordingly, when the scan lines S11 to S1n, S21 and S22, and S31 and S32 and the light emitting control lines E11 to E1n, E21 and E22, and E31 and E32 extend along the width direction thereof, the length of each of the first scan lines S11 to S1n and the first light emitting control lines E11 to E1n is longer than that of each of the second scan lines S21 and S22 and the second light emitting control lines E21 and E22. Differences in lengths between the scan lines S11 to S1n, S21 and S22, and S31 and S32 and differences in lengths between the light emitting control lines E11 to E1n, E21 and E22, and E31 and E32 may cause differences between load values of the scan lines S11 to S1n, S21 and S22, and S31 and S32 and differences between load values of the light emitting control lines E11 to E1n, E21 and E22, and E31 and E32. That is, a load value of the first scan lines S11 to S1n may be greater than that of the second scan lines S21 and S22. In addition, a load value of the first light emitting control lines E11 to E1n may be greater than that of the second light emitting control lines E21 and E22. A voltage drop of the data signal may cause differences in luminance between the first pixels PXL1 of the first pixel region PXA1 and the second pixels PXL2 of the second pixel region PXA2. The third pixels PXL3 may be provided in the same form as the second pixels PXL2, and therefore, a detailed description of the third pixels PXL3 will be omitted.

Figure 4:
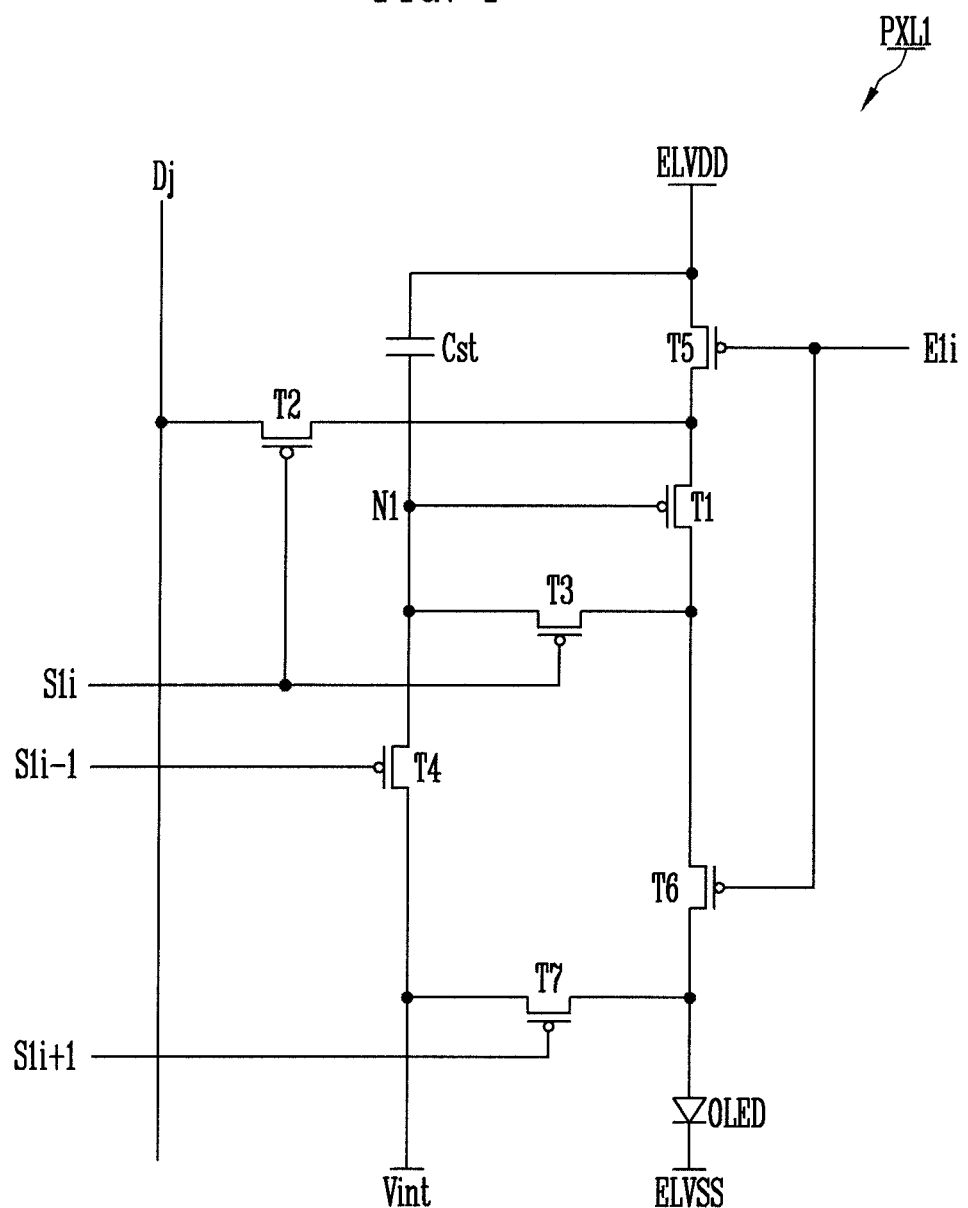
FIG. 4 is an equivalent circuit diagram illustrating an embodiment of a first pixel shown in FIG. 3.

FIG. 4 is an equivalent circuit diagram illustrating an embodiment of the first pixel shown in FIG. 3. For convenience of description, a pixel connected to a jth data line Dj and an ith first scan line S1i will be illustrated in FIG. 4.

Referring to FIGS. 3 and 4, the first pixel PXL1 according to the present embodiment may include an organic light emitting device OLED, first to seventh transistors T1 to T7, and a storage capacitor Cst.

An anode of the organic light emitting device OLED may be connected to the first transistor T1 via the sixth transistor T6, and a cathode of the organic light emitting device OLED may be connected to a first power source ELVSS. The organic light emitting device OLED may generate light (e.g., light with a predetermined luminance) corresponding to the amount of current supplied from the first transistor T1.

A second power source ELVDD may be set to a higher voltage than the first power source ELVSS such that current can flow in the organic light emitting device OLED.

The seventh transistor T7 may be connected between an initialization power source Vint and the anode of the organic light emitting device OLED. In addition, a gate electrode of the seventh transistor T7 may be connected to an (i+1)th first scan line S1i+1. The seventh transistor T7 may be turned on when a scan signal is supplied to the (i+1)th first scan line S1i+1, to supply a voltage of the initialization power source Vint to the anode of the organic light emitting device OLED. Here, the initialization power source Vint may be set to a lower voltage than a data signal.

The sixth transistor T6 may be connected between the first transistor T1 and the organic light emitting device OLED. In addition, a gate electrode of the sixth transistor T6 may be connected to an ith first light emitting control line E1i. The sixth transistor T6 may be turned off when a light emitting control signal is supplied to the ith first light emitting control line E1i, and otherwise may be turned on.

The fifth transistor T5 may be connected between the second power source ELVDD and the first transistor T1. In addition, a gate electrode of the fifth transistor T5 may be connected to the ith first light emitting control line E1i. The fifth transistor T5 may be turned off when a light emitting control signal is supplied to the ith first light emitting control line E1i, and otherwise may be turned on.

A first electrode of the first transistor (drive transistor) T1 may be connected to the second power source ELVDD via the fifth transistor T5, and a second electrode of the first transistor T1 may be connected to the anode of the organic light emitting device OLED via the sixth transistor T6. In addition, a gate electrode of the first transistor T1 may be connected to a first node N1. The first transistor T1 may control the amount of current flowing from the second power source ELVDD to the first power source ELVSS via the organic light emitting device OLED according to a voltage of the first node N1.

The third transistor T3 may be connected between the second electrode of the first transistor T1 and the first node N1. In addition, a gate electrode of the third transistor T3 may be connected to the ith first scan line S1i. The third transistor T3 may be turned on when a scan signal is supplied to the ith first scan line S1i to allow the second electrode of the first transistor T1 to be electrically connected to the first node N1. Therefore, the first transistor T1 may be diode-connected when the third transistor T3 is turned on.

The fourth transistor T4 may be connected between the first node N1 and the initialization power source Vint. In addition, a gate electrode of the fourth transistor T4 may be connected to an (i−1)th first scan line S1i−1. The fourth transistor T4 may be turned on when a scan signal is supplied to the (i−1)th first scan line S1i−1 to supply the voltage of the initialization power source Vint to the first node N1.

The second transistor T2 may be connected between the jth data line Dj and the first electrode of the first transistor T1. In addition, a gate electrode of the second transistor T2 may be connected to the ith first scan line S1i. The second transistor T2 may be turned on when a scan signal is supplied to the ith first scan line S1i, to allow the jth data line Dj to be electrically connected to the first electrode of the first transistor T1.

The storage capacitor Cst may be connected between the second power source ELVDD and the first node N1. The storage capacitor Cst may store a data signal and a voltage corresponding to a threshold voltage of the first transistor T1.

Meanwhile, each of the second and third pixels PXL2 and PXL3 may be implemented with the same circuit as the first pixel PXL1. Therefore, detailed descriptions of the second and third pixels PXL2 and PXL3 will be omitted.

Figure 5:
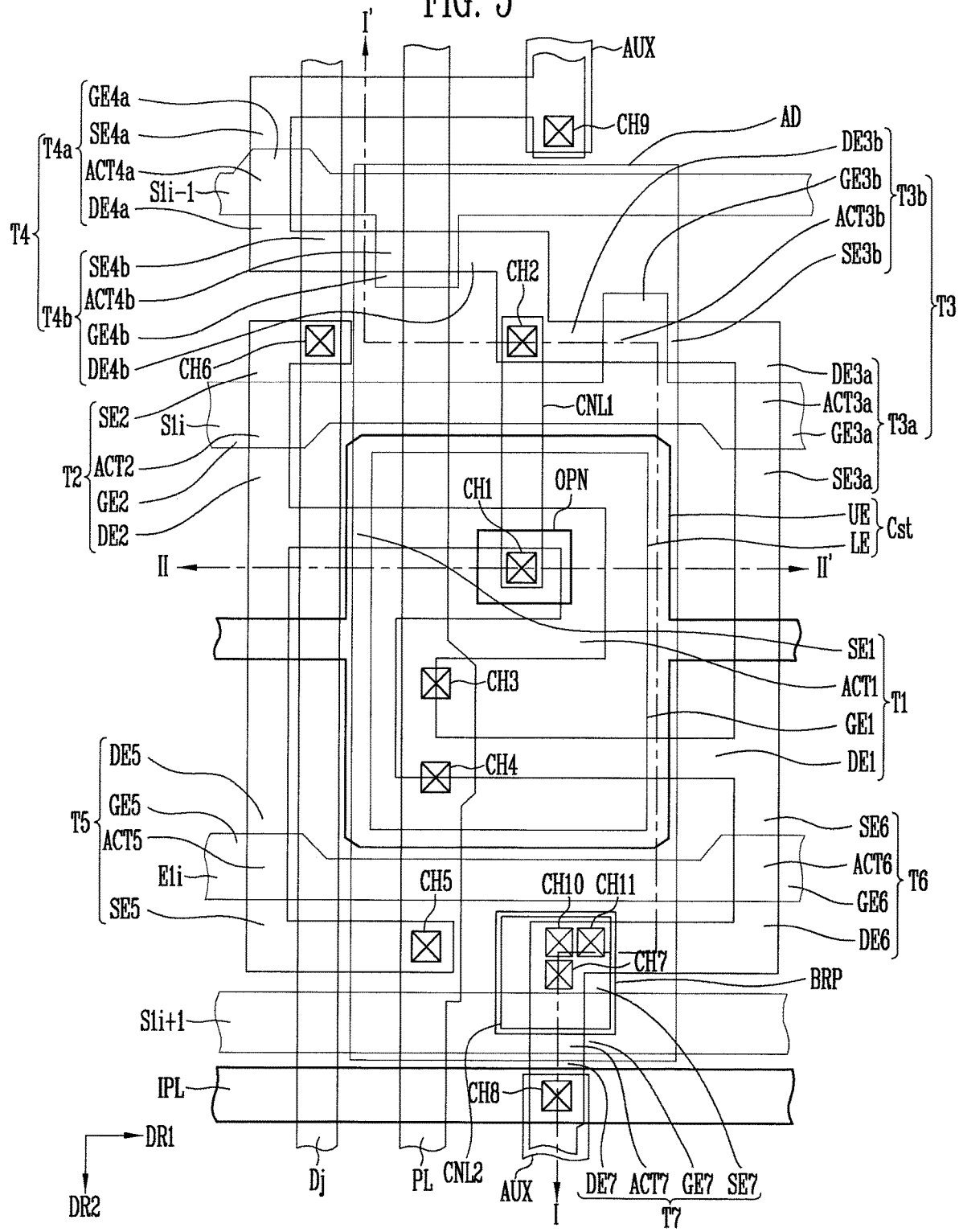
FIG. 5 is a plan view illustrating in detail the first pixel shown in FIG. 4.
Figure 6:
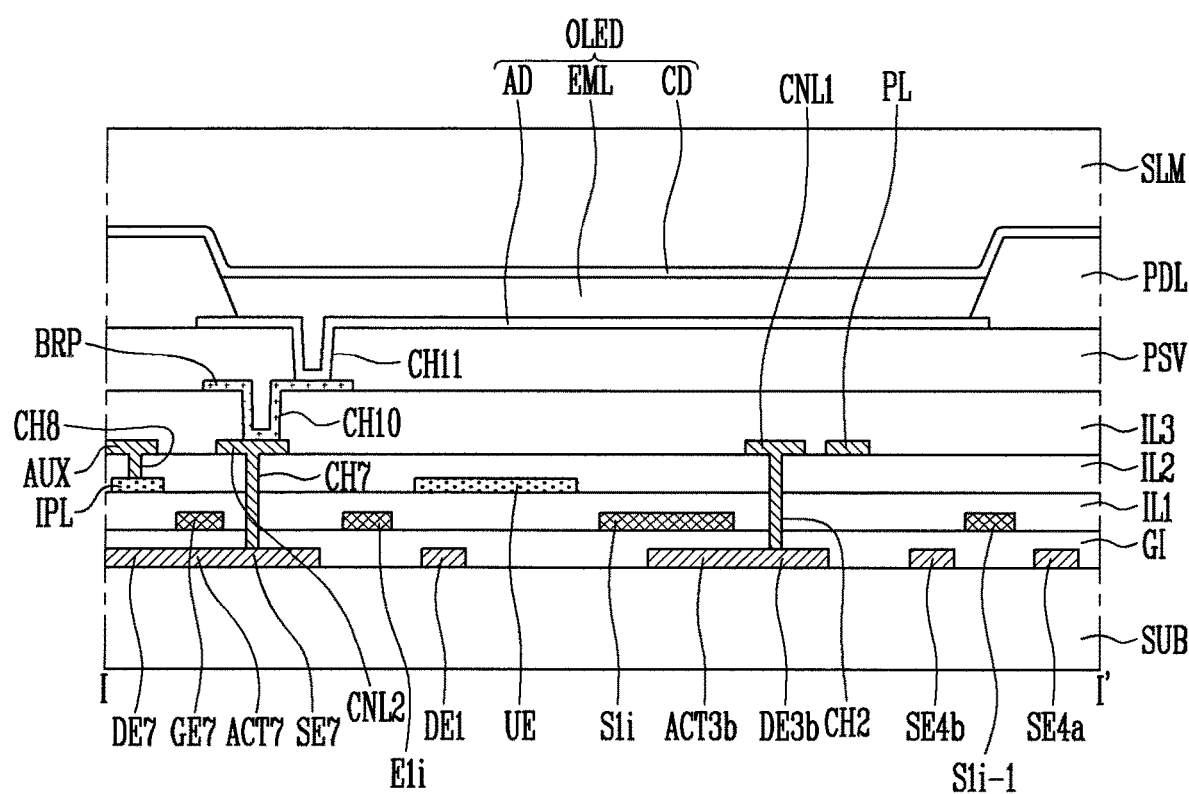
FIG. 6 is a sectional view taken along the line I-I' of FIG. 5.
Figure 7:
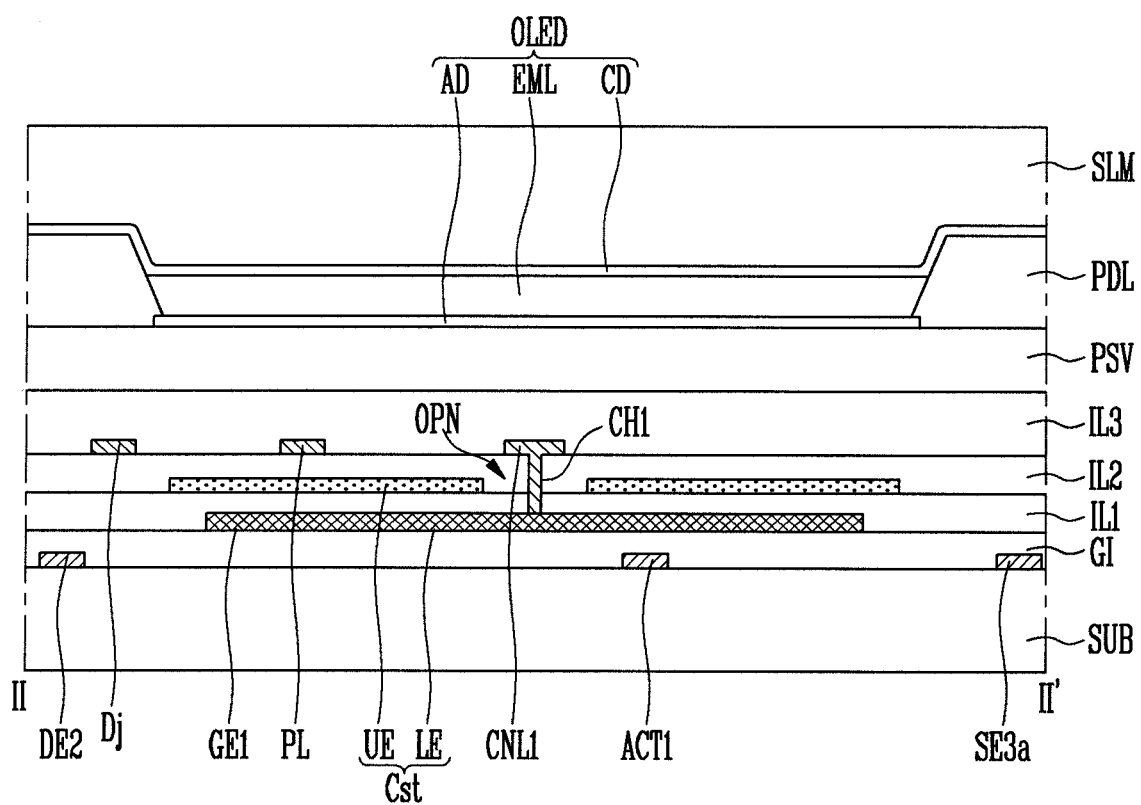
FIG. 7 is a sectional view taken along the line II-II' of FIG. 5.

FIG. 5 is a plan view illustrating in detail the first pixel shown in FIG. 4. FIG. 6 is a sectional view taken along the line I-I' of FIG. 5. FIG. 7 is a sectional view taken along the line II-II' of FIG. 5. Based on one first pixel PXL1 located on an ith row and a jth column in the first pixel region PXA1, three first scan lines S1i−1, S1i, and S1i+1, a first light emitting control line Eli, a power line PL, and a data line Dj, which are connected to the one first pixel PXL1, are illustrated in FIGS. 5 to 7. In FIGS. 5 to 7, for convenience of description, a first scan line on an (i−1)th row is referred to as an "(i−1)th first scan line S1i−1," a first scan line on the ith row is referred to as an "ith first scan line S1i," a first scan line on an (i+1)th row is referred to as an "(i+1)th first scan line S1i+1," a first light emitting control line on the ith row is referred to as a "first light emitting control line E1i," a data line on the jth column is referred to as a "data line Dj," and a power line on the jth column is referred to as a "power line PL."

Referring to FIGS. 4 to 7, the display device may include a substrate SUB, a line unit, and pixels, e.g., first pixels PXL1.

The substrate SUB may include a transparent insulating material to enable light to be transmitted therethrough. The substrate SUB may be a rigid substrate. For example, the substrate SUB may be one of a glass substrate, a quartz substrate, a glass ceramic substrate, and a crystalline glass substrate. In addition, the substrate SUB may be a flexible substrate. Here, the substrate SUB may be one of a film substrate including a polymer organic material and a plastic substrate. For example, the substrate SUB may include at least one selected from the group consisting of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be variously changed, and may include a fiber reinforced plastic (FRP), etc.

The line unit (e.g., the plurality of lines) provides signals to each of the first pixels PXL1, and may include first scan lines S1$i$−1, S1$i$, and S1$i$+1, a data line Dj, a first light emitting control line E1$i$, a power line PL, and an initialization power line IPL.

The first scan lines S1$i$−1, S1$i$, and S1$i$+1 may extend in the first direction DR1. The first scan lines S1$i$−1, S1$i$, and S1$i$+1 may include an (i−1)th first scan line S1$i$−1, an ith first scan line S1$i$, and an (i+1)th first scan line S1$i$+1, which are sequentially arranged along the second direction DR2. A scan signal may be applied to each of the first scan lines S1$i$−1, S1$i$, and S1$i$+1. For example, an (i−1)th scan signal may be applied to the (i−1)th first scan line S1$i$−1, an ith scan signal may be applied to the ith first scan line S1$i$, and an (i+1)th scan signal may be applied to the (i+1)th first scan line S1$i$+1.

The three first scan lines S1$i$−1, S1$i$, and S1$i$+1 have been illustrated so as to provide the scan signal to each of the first scan lines S1$i$−1, S1$i$, and S1$i$+1, but the present disclosure is not limited thereto. For example, in each of the first pixels PXL, the scan signal may be applied through two first scan lines S1$i$−1 and S1$i$. In this case, an ith first scan line S1$i$ out of the two first scan lines S1$i$−1 and S1$i$ branches off into two lines, and the branching-off ith first scan lines S1$i$ may be connected to transistors different from each other. For example, the ith first scan line S1$i$ may include an upper ith first scan line adjacent to the (i−1)th first scan line S1$i$−1, and a lower ith first scan line more distant from the (i−1)th first scan line S1$i$−1 than the upper ith first scan line.

The first light emitting control line E1$i$ may extend in the first direction DR1. The first light emitting control line E1$i$ is located to be spaced apart from the ith first scan line S1$i$ and the (i+1)th first scan line S1$i$+1 and to be between the ith first scan line S1$i$ and the (i+1)th first scan line S1$i$+1. A light emitting control signal is applied to the first light emitting control line E1$i$.

The data line Dj may extend in the second direction DR2. A data signal may be applied to the data line Dj.

The power line PL may extend along the second direction DR2. The power line PL may be located to be spaced apart from the data line Dj. A second power source (see ELVDD of FIG. 3) may be applied to the power line PL.

The initialization power line IPL may extend along the first direction DR1. The initialization power line IPL may be provided between the (i+1)th first scan line S1$i$+1 and an (i−1)th first scan line S1$i$−1 on a next row (e.g., of a next pixel). An initialization power source Vint may be applied to the initialization power line IPL.

Each of the first pixels PXL1 may include first to seventh transistors T1 to T7, a storage capacitor Cst, and an organic light emitting device OLED.

The first transistor T1 may include a first gate electrode GE1, a first active pattern ACT1, a first source electrode SE1, a first drain electrode DE1, and a first contact line CNL1.

The first gate electrode GE1 may be connected to a third drain electrode DE3 (e.g., DE3$a$ and DE3$b$) of the third transistor T3 and a fourth drain electrode DE4 (e.g., DE4$a$ and DE4$b$) of the fourth transistor T4. The first contact line CNL1 may connect between the first gate electrode GE1 and the third and fourth drain electrodes DE3 and DE4. One end of the first contact line CNL1 may be connected to the first gate electrode GE1 through a first contact hole CH1, and the other end of the first contact line CNL1 may be connected to the third and fourth drain electrodes DE3 and DE4 through a second contact hole CH2.

The first active pattern ACT1, the first source electrode SE1, and the first drain electrode DE1 may be formed of a semiconductor layer that is either undoped or doped with impurities. For example, the first source electrode SE1 and the first drain electrode DE1 may be formed of a semiconductor layer doped with impurities, and the first active pattern ACT1 may be formed of a semiconductor layer undoped with impurities.

The first active pattern ACT1 has a bar shape extending in a predetermined direction, and may have a shape in which it is bent multiple times along the extending direction. The first active pattern ACT1 may overlap with the first gate electrode GE1 when viewed on a plane. As the first active pattern ACT1 is formed long, a channel region of the first transistor T1 can be formed long. Thus, the driving range of a gate voltage applied to the first transistor T1 is widened. Accordingly, the gray scale of light emitted from the organic light emitting device OLED can be finely controlled.

The first source electrode SE1 may be connected to one end of the first active pattern ACT1. The first source electrode SE1 may be connected to a second drain electrode DE2 of the second transistor T2, and may be connected to a fifth drain electrode DE5 of the fifth transistor T5. The first drain electrode DE1 may be connected to the other end of the first active pattern ACT1. The first drain electrode DE1 may be connected to a third source electrode SE3 of the third transistor T3 and a sixth source electrode SE6 of the sixth transistor T6.

The second transistor T2 may include a second gate electrode GE2, a second active pattern ACT2, a second source electrode SE2, and the second drain electrode DE2.

The second gate electrode GE2 may be connected to the ith first scan line S1$i$. The second gate electrode GE2 may be provided as a portion of the ith first scan line S1$i$, or may be provided in a shape protruding from the ith first scan line S1$i$. The second active pattern ACT2, the second source electrode SE2, and the second drain electrode DE2 may be formed of a semiconductor having portions respectively undoped or doped with impurities. For example, the second source electrode SE2 and the second drain electrode DE2 may be formed of a semiconductor doped with impurities, and the second active pattern ACT2 may be formed of a semiconductor layer that is undoped with impurities. The second active pattern ACT2 corresponds to a portion overlapping with the second gate electrode GE2. One end of the second source electrode SE2 may be connected to the second active pattern ACT2. The other end of the second source electrode SE2 may be connected to the data line Dj through a sixth contact hole CH6. One end of the second drain electrode DE2 may be connected to the second active pattern ACT2. The other end of the second drain electrode DE2 may be connected to the first source electrode SE1 of the first transistor T1 and the fifth drain electrode DE5 of the fifth transistor T5.

The third transistor T3 may be provided in a double gate structure so as to prevent a leakage current. That is, the third transistor T3 may include a 3ath transistor T3$a$ and a 3bth transistor T3$b$. The 3ath transistor T3$a$ may include a 3ath gate electrode GE3$a$, a 3ath active pattern ACT3$a$, a 3ath source electrode SE3*a*, and a 3ath drain electrode DE3*a*. The 3bth transistor T3*b* may include a 3bth gate electrode GE3*b*, a 3bth active pattern ACT3*b*, a 3bth source electrode SE3*b*, and a 3bth drain electrode DE3*b*. Hereinafter, the 3ath gate electrode GE3*a* and the 3bth gate electrode GE3*b* are referred to as a third gate electrode GE3, the 3ath active pattern ACT3*a* and the 3bth active pattern ACT3*b* are referred to as a third active pattern ACT3, the 3ath source electrode SE3*a* and the 3bth source electrode SE3*b* are referred to as the third source electrode SE3, and the 3ath drain electrode DE3*a* and the 3bth drain electrode DE3*b* are referred to as the third drain electrode DE3.

The third gate electrode GE3 may be connected to the ith first scan line S1*i*. The third gate electrode GE3 may be provided as a portion of the ith first scan line S1*i* or may be provided in a shape protruding from the ith first scan line S1*i*.

The third active pattern ACT3, the third source electrode SE3, and the third drain electrode DE3 may be formed of a semiconductor layer having portions that are either undoped or doped with impurities. For example, the third source electrode SE3 and the third drain electrode DE3 may be formed of a semiconductor layer doped with impurities, and the third active pattern ACT3 may be formed of a semiconductor layer undoped with impurities. The third active pattern ACT3 corresponds to a portion overlapping with the third gate electrode GE3. One end of the third source electrode SE3 may be connected to the third active pattern ACT3. The other end of the third source electrode SE3 may be connected to the first drain electrode DE1 of the first transistor T1 and the sixth source electrode SE6 of the sixth transistor T6. One end of the third drain electrode DE3 may be connected to the third active pattern ACT3. The other end of the third drain electrode DE3 may be connected to the fourth drain electrode DE4 of the fourth transistor T4. Also, the third drain electrode DE3 may be connected to the first gate electrode GE1 of the first transistor T1 through the first contact line CNL1, the second contact hole CH2, and the first contact hole CH1.

The fourth transistor T4 may be provided in a double gate structure so as to prevent a leakage current. That is, the fourth transistor T4 may include a 4ath transistor T4*a* and a 4bth transistor T4*b*. The 4ath transistor T4*a* may include a 4ath gate electrode GE4*a*, a 4ath active pattern ACT4*a*, a 4ath source electrode SE4*a*, and a 4ath drain electrode DE4*a*, and the 4bth transistor T4*b* may include a 4bth gate electrode GE4*b*, a 4bth active pattern ACT4*b*, a 4bth source electrode SE4*b*, and a 4bth drain electrode DE4*b*. Hereinafter, the 4ath gate electrode GE4*a* and the 4bth gate electrode GE4*b* are referred to as a fourth gate electrode GE4, the 4ath active pattern ACT4*a* and the 4bth active pattern ACT4*b* are collectively referred to as a fourth active pattern ACT4, the 4ath source electrode SE4*a* and the 4bth source electrode SE4*b* are collectively referred to as a fourth source electrode SE4, and the 4ath drain electrode DE4*a* and the 4bth drain electrode DE4*b* are collectively referred to as the fourth drain electrode DE4.

The fourth gate electrode GE4 may be connected to the (i−1)th first scan line S1*i*−1. The fourth gate electrode GE4 may be provided as a portion of the (i−1)th first scan line S1*i*−1, or may be provided in a shape protruding from the (i−1)th first scan line S1*i*−1.

The fourth active pattern ACT4, the fourth source electrode SE4, and the fourth drain electrode DE4 may be formed of a semiconductor layer having portions that are either undoped or doped with impurities. For example, the fourth source electrode SE4 and the fourth drain electrode DE4 may be formed of portions of a semiconductor layer that are doped with impurities, and the fourth active pattern ACT4 may be formed of a portion of a semiconductor layer that is undoped with impurities. The fourth active pattern ACT4 corresponds to a portion overlapping with the fourth gate electrode GE4.

One end of the fourth source electrode SE4 may be connected to the fourth active pattern ACT4. The other end of the fourth source electrode SE4 may be connected to an initialization power line IPL of a first pixel PXL1 on an (i−1)th row and a seventh drain electrode DE7 of a seventh transistor T7 of the first pixel PXL1 on the (i−1)th row. An auxiliary connection line AUX may be located between the fourth source electrode SE4 and the initialization power line IPL. One end of the auxiliary connection line AUX may be connected to the fourth source electrode SE4 through a ninth contact hole CH9. The other end of the auxiliary connection line AUX may be connected to an initialization power line IPL on the (i−1)th row through an eighth contact hole CH8 of the first pixel PXL1 on the (i−1)th row. One end of the fourth drain electrode DE4 may be connected to the fourth active pattern ACT4. The other end of the fourth drain electrode DE4 may be connected to the third drain electrode DE3 of the third transistor T3. Also, the fourth drain electrode DE4 may be connected to the first gate electrode GE1 of the first transistor T1 through the first contact line CNL1, the second contact hole CH2, and the first contact hole CH1.

The fifth transistor T5 may include a fifth gate electrode GE5, a fifth active pattern ACT5, a fifth source electrode SE5, and the fifth drain electrode DE5.

The fifth gate electrode GE5 may be connected to the first light emitting control line E1*i*. The fifth gate electrode GE5 may be provided as a portion of the first light emitting control line E1*i*, or may be provided in a shape protruding from, or extending from, the first light emitting control line E1*i*. The fifth active pattern ACT5, the fifth source electrode SE5, and the fifth drain electrode DE5 may be formed of a semiconductor layer having regions that are undoped or are doped with impurities. For example, the fifth source electrode SE5 and the fifth drain electrode DE5 may be formed of a semiconductor layer doped with impurities, and the fifth active pattern ACT5 may be formed of a semiconductor layer undoped with impurities. The fifth active pattern ACT5 corresponds to a portion overlapping with the fifth gate electrode GE5. One end of the fifth source electrode SE5 may be connected to the fifth active pattern ACT5. The other end of the fifth source electrode SE5 may be connected to the power line PL through a fifth contact hole CH5. One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode SE6 may be connected to the first light emitting control line E1*i*. The sixth gate electrode SE6 may be provided as a portion of the first light emitting control line E1*i*, or may be provided in a shape protruding from the first light emitting control line E1*i*. The sixth active pattern ACT6, the sixth source electrode SE6, and the sixth drain electrode DE6 may be formed of a semiconductor layer undoped or doped with impurities. For example, the sixth source electrode SE6 and the sixth drain electrode DE6 may be formed of a semiconductor layer doped with impurities, and the sixth active pattern ACT6 may be formed of a semiconductor layer undoped with impurities. The sixth active pattern ACT6 corresponds to a portion overlapping with the sixth gate electrode GE6. One end of the sixth source electrode SE6 may be connected to the sixth active pattern ACT6. The other end of the sixth source electrode SE6 may be connected to the first drain electrode DE1 of the first transistor T1 and to the third source electrode SE3 of the third transistor T3. One end of the sixth drain electrode DE6 may be connected to the sixth active pattern ACT6. The other end of the sixth drain electrode DE6 may be connected to a seventh source electrode SE7 of the seventh transistor T7.

The seventh transistor T7 may include a seventh gate electrode GE7, a seventh active pattern ACT7, the seventh source electrode SE7, and a seventh drain electrode DE7.

The seventh gate electrode GE7 may be connected to the (i+1)th first scan line S1$i$+1. The seventh gate electrode GE7 may be provided as a portion of the (i+1)th first scan line S1$i$+1, or may extend from the (i+1)th first scan line S1$i$+1. The seventh active pattern ACT7, the seventh source electrode SE7, and the seventh drain electrode DE7 may be formed of a semiconductor layer. For example, the seventh source electrode SE7 and the seventh drain electrode DE7 may be formed of portions of a semiconductor layer doped with impurities, and the seventh active pattern ACT7 may be formed of a portion of the semiconductor layer undoped with impurities. The seventh active pattern ACT7 corresponds to a portion overlapping with the seventh gate electrode GE7. One end of the seventh source electrode SE7 may be connected to the seventh active pattern ACT7. The other end of the seventh source electrode SE7 may be connected to the sixth drain electrode DE6 of the sixth transistor T6. One end of the seventh drain electrode DE7 may be connected to the seventh active pattern ACT7. The other end of the seventh drain electrode DE7 may be connected to the initialization power line IPL. Also, the seventh drain electrode DE7 may be connected to a fourth source electrode SE4 of a fourth transistor T4 of a first pixel PXL on an (i+1)th row. The seventh drain electrode DE7 may be connected to the fourth source electrode SE4 of the fourth transistor T4 of the first pixel PXL on the (i+1)th row through the auxiliary connection line AUX, the eighth contact hole CH8, and the ninth contact hole CH9.

The storage capacitor Cst may include a lower electrode LE and an upper electrode UE. The lower electrode LE may be configured as the first gate electrode GE1 of the first transistor T1. The upper electrode UE overlaps with the first gate electrode GE1, and may cover the lower electrode LE when viewed on a plane. As the overlapping area of the upper electrode UE and the lower electrode LE is widened, the capacitance of the storage capacitor Cst may be increased. The upper electrode UE may extend in the first direction DR1. In an embodiment of the present disclosure, a voltage having the same level as the second power source ELVDD may be applied to the upper electrode UE. The upper electrode UE may have an opening OPN in a region including the first contact hole CH1 through which the first gate electrode GE1 and the first contact line CNL1 are connected to each other.

The light emitting device OLED may include an anode electrode AD, a cathode electrode CD, and an emitting layer EML located between the anode electrode AD and the cathode electrode CD. The anode electrode AD may be provided in a light emitting region corresponding to each first pixel PXL1. The anode electrode AD may be connected to the seventh source electrode SE7 of the seventh transistor T7 and the sixth drain electrode DE6 of the sixth transistor T6 through a seventh contact hole CH7 and a tenth contact hole CH10. A second contact line CNL2 and a bridge pattern BRP may be provided between the seventh contact hole CH7 and the tenth contact hole CH10 to connect the anode electrode AD to the sixth drain electrode DE6 and the seventh source electrode SE7.

Hereinafter, a structure of the display device according to the embodiment of the present disclosure will be described along a stacking order with reference to FIGS. 5 to 7.

Active patterns ACT1 to ACT7 (hereinafter, referred to as 'ACT') may be located on the substrate SUB. The active patterns may include first to seventh active patterns ACT1 to ACT7. The first to seventh active patterns ACT1 to ACT7 may include a semiconductor material.

A buffer layer may be located between the substrate SUB and the first to seventh active patterns ACT1 to ACT7.

A gate insulating layer GI may be located on the substrate SUB on which the first to seventh active patterns ACT1 to ACT7 are formed.

The (i−1)th first scan line S1$i$−1, the ith first scan line S1$i$, the first light emitting control line E1$i$, and the first to seventh gate electrodes GE1 to GE7 may be located on the gate insulating layer GI. The first gate electrode GE1 may be the lower electrode LE of the storage capacitor Cst. The second gate electrode GE2 and the third gate electrode GE3 may be integrally formed with the ith first scan line S1$i$. The fourth gate electrode GE4 may be integrally formed with the (i−1)th first scan line S1$i$−1. The fifth gate electrode GE5 and the sixth gate electrode GE6 may be integrally formed with the light emitting control line E1$i$. The seventh gate electrode GE7 may be integrally formed with the (i+1)th first scan line S1$i$+1.

A first insulating layer IL1 may be located on the substrate SUB on which the (i−1)th first scan line S1$i$−1 and the like are formed.

The upper electrode UE of the storage capacitor Cst and the initialization power line IPL may be located on the first insulating layer IL1. The upper electrode UE may cover, or overlap, the lower electrode LE. The upper electrode UE and the lower electrode LE with the first insulating layer IL1 interposed therebetween may constitute the storage capacitor Cst.

A second insulating layer IL2 may be located on the substrate SUB (e.g., on the first insulating layer IL1 on which the upper electrode UE and the initialization power line IPL are located).

The data line Dj, the power line PL, the first and second contact lines CNL1 and CNL2, and the auxiliary connection line AUX may be located on the second insulating layer IL2.

The data line Dj may be connected to the second source electrode SE2 through the sixth contact hole CH6 sequentially passing through the gate insulating layer GI and the first and second insulating layers IL1 and IL2.

The power line PL may be connected to the upper electrode UE of the storage capacitor Cst through third and fourth contact holes CH3 and CH4 passing through the second insulating layer IL2. The power line PL may also be connected to the fifth source electrode SE5 through the fifth contact hole CH5 sequentially passing through the gate insulating layer GI and the first and second insulating layers IL1 and IL2.

The first contact line CNL1 may be connected to the first gate electrode GE1 (e.g., to the lower electrode LE) through a first contact hole CH1 sequentially passing through the first and second insulating layers IL1 and IL2. Also, the first contact line CNL1 may be connected to a third drain electrode DE3 and a fourth drain electrode DE4 through a second contact hole CH2 sequentially passing through the gate insulating layer GI and the first and second insulating layers IL1 and IL2.

The second contact line CNL2 may be a pattern provided as a medium for connecting the sixth drain electrode DE6 and the anode electrode AD and located between the sixth drain electrode DE6 and the anode electrode AD. The second contact line CNL2 may be connected to the sixth drain electrode DE6 and the seventh source electrode SE7 through the seventh contact hole CH7 sequentially passing through the gate insulating layer GI and the first and second insulating layers IL1 and IL2.

The auxiliary connection line AUX may be connected to the initialization power line IPL through the eighth contact hole CH8 passing through the second insulating layer IL2. Also, the auxiliary connection line AUX may be connected to the fourth source electrode SE4 and the seventh drain electrode DE7 of the first pixel PXL1 on the (i−1)th row through the ninth contact hole CH9 sequentially passing through the gate insulating layer GI and the first and second insulating layers IL1 and IL2.

A third insulating layer IL3 may be located on the substrate SUB (e.g., on the second insulating layer IL2 on which the data line Dj and the like are located).

The bridge pattern BRP may be located on the third insulating layer IL3. The bridge pattern BRP may be connected to the second contact line CNL2 through the tenth contact hole CH10 passing through the third insulating layer IL3.

A protective layer PSV may be located on the substrate SUB (e.g., on the third insulating layer IL3 on which the bridge pattern BRP is located).

The anode electrode AD may be located on the protective layer PSV. The anode electrode AD may be connected to the bridge pattern BRP through an eleventh contact hole CH11 passing through the protective layer PSV. Because the bridge pattern BRP is connected to the second contact line CNL2 through the tenth contact hole CH10, the anode electrode AD may be finally connected to the sixth drain electrode DE6 and the seventh source electrode SE7 through the bridge pattern BRP and the second contact line CNL2.

A pixel defining layer PDL defining a first pixel region (see PXA1 of FIG. 1) to correspond to each first pixel PXL1 may be located on the substrate SUB (e.g., on the protective layer PSV on which the anode electrode AD is formed). The pixel defining layer PDL exposes a top surface of the anode electrode AD, and may protrude from the substrate SUB along the circumference of the first pixel PXL1.

The emitting layer EML may be provided in the first pixel region PXA1 surrounded by the pixel defining layer PDL, and the cathode electrode CD may be provided on the emitting layer EML.

The pixel defining layer PDL may include an organic insulating material. For example, the pixel defining layer PDL may include at least one selected from the group consisting of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The emitting layer EML may be located on the exposed surface of the anode electrode AD. The emitting layer EML may have a multi-layered thin film structure at least including a light generation layer (LGL) for emitting light through the re-combination of the injected electrons and holes. For example, the emitting layer EML may include a hole injection layer (HIL) for injecting holes, a hole transport layer (HTL) having an excellent hole transporting property for increasing the opportunity for holes and electrons to be re-combined by suppressing the movement of electrons that fail to be combined in the LGL, a hole blocking layer (HBL) for suppressing the movement of holes that fail to be combined in the LGL, an electron transport layer (ETL) smoothly transporting electrons to the LGL, and an electron injection layer (EIL) for injecting electrons.

The color of light generated in the LGL may be one of red, green, blue, and white, but this embodiment is not limited thereto. For example, the color of light generated in the LGL of the emitting layer EML may also be one of magenta, cyan, and yellow.

The HIL, HTL, HBL, ETL, and EIL may be common layers connected in light emitting regions adjacent to each other.

An encapsulation layer SLM covering the cathode electrode CD may be provided over the cathode electrode CD.

The encapsulation layer SLM may prevent oxygen and moisture from penetrating into the organic light emitting device OLED. The encapsulation layer SLM may include an inorganic layer. The inorganic layer may include at least one selected from the group consisting of silicon oxide, silicon nitride, silicon oxynitride, aluminum oxide, titanium oxide, zirconium oxide, and tin oxide. The encapsulation layer SLM covers the first to third pixel regions (see PXA1, PXA2, and PXA3 of FIG. 1) of the first to third regions (see A1 to A3 of FIG. 1), and may extend up to the outside of the first to third pixel regions PXA1, PXA2, and PXA3.

The second pixel (see PXL2 of FIG. 1) provided in the second pixel region PXA2 and the third pixel (see PXL3 of FIG. 1) provided in the third pixel region PXA3 have the substantially same pixel structure as the first pixel PXL1, and therefore, their descriptions will be omitted.

Figure 8:
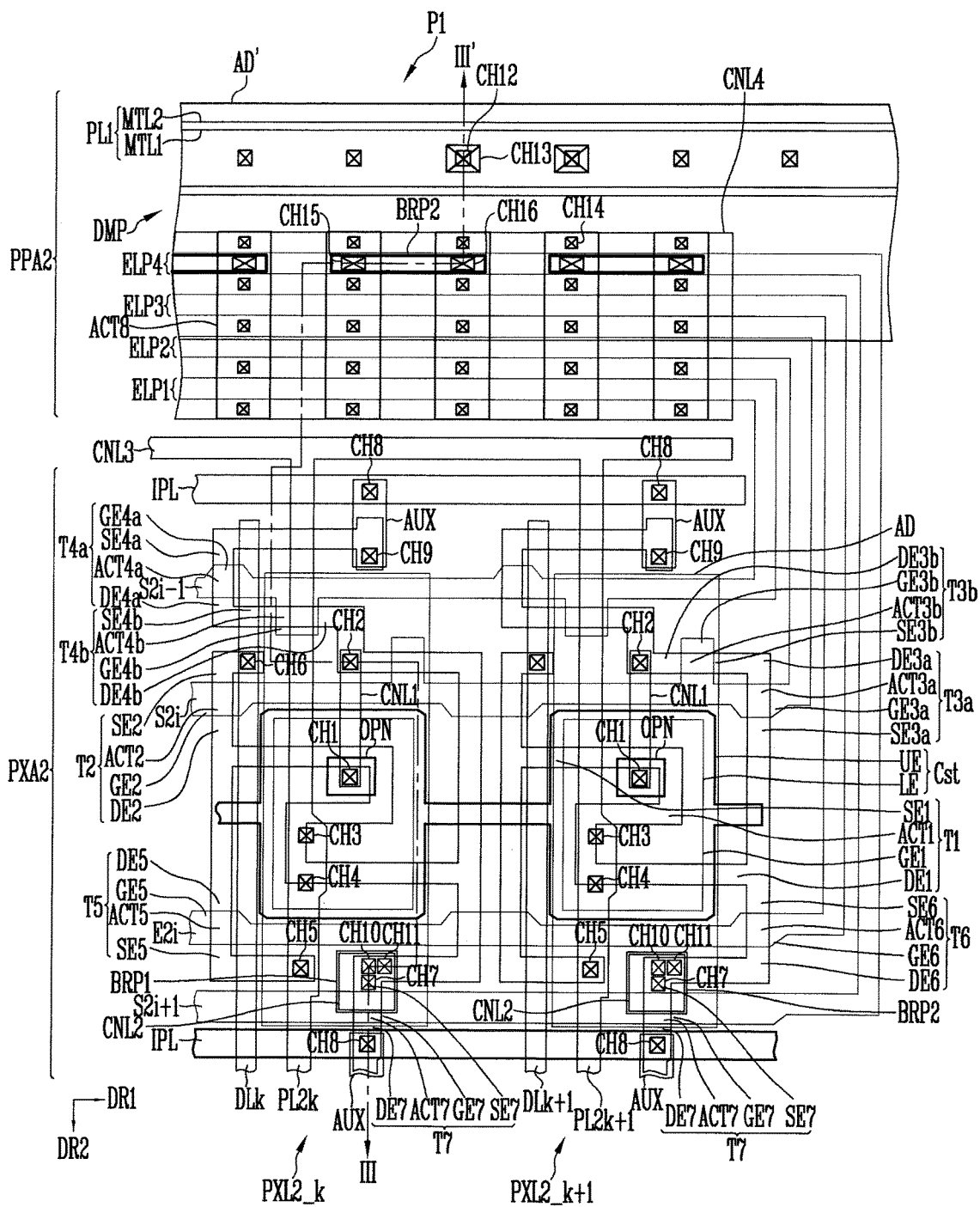
FIG. 8 is a plan view conceptually illustrating a portion corresponding to P1 of FIG. 1.
Figure 9:
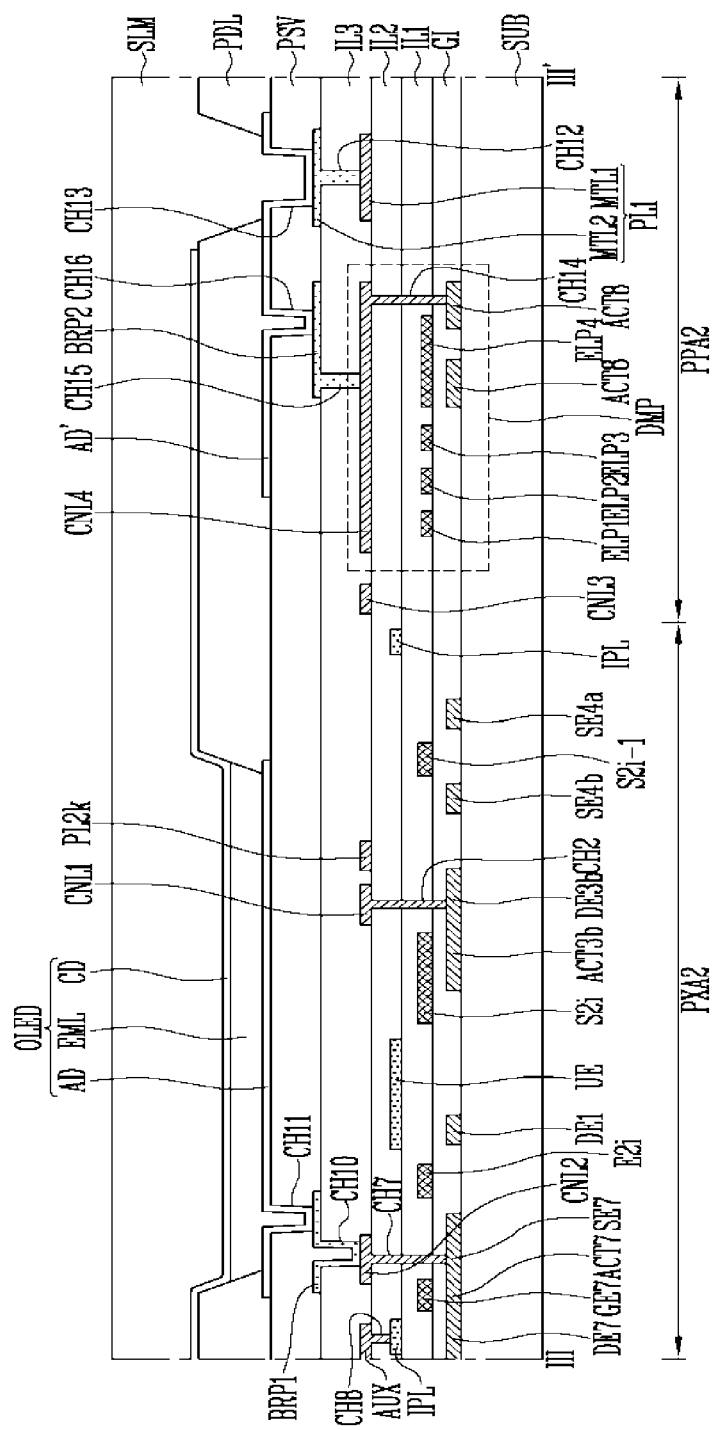
FIG. 9 is a sectional view taken along the line III-III' of FIG. 8.

FIG. 8 is a plan view conceptually illustrating a portion corresponding to P1 of FIG. 1. FIG. 9 is a sectional view taken along the line III-III' of FIG. 8.

For convenience of description, based on a kth second pixel PXL2_$k$ located on an ith row and a kth column, and a (k+1)th second pixel PXL2_$k$+1 located on the ith row and a (k+1)th column, which are provided in a second pixel region PXA2, three second scan lines S2$i$−1, S2$i$, and S2$i$+1, a second light emitting control line E2$i$, and two data lines DLk and DLk+1, which are connected to the two second pixels PXL2_$k$ and PXL2_$k$+1, are illustrated in FIGS. 8 and 9. Also, for convenience of description, the two second pixels PXL2_$k$ and PXL2_$k$+1, a dummy part DMP located on the same column as the two second pixels PXL2_$k$ and PXL2_$k$+1 in the vertical direction, and a first power line PL1 surrounding the outside of the dummy part DMP are mainly illustrated in FIGS. 8 and 9.

In addition, for convenience of description, a second scan line on an (i−1)th row is referred to as an "(i−1)th second scan line S2$i$−1," a second scan line on the ith row is referred to as an "ith second scan line S2$i$," a second scan line on an (i+1)th row is referred to as an "(i+1)th second scan line S2$i$+1," a second light emitting control line on the ith row is referred to as a "light emitting control line E2$i$," a data line on the kth column is referred to as a "first data line DLk," a data line on the (k+1)th column is referred to as a second data line DLk+1," a second power line on the kth column is referred to as a "kth second power line PL2$k$," and a second power line on the (k+1)th column is referred to as a "(k+1)th second power line PL2$k$+1."

Referring to FIGS. 1, 8, and 9, in the display device according to the embodiment of the present disclosure, structures having different parasitic capacitances for the respective pixel regions PXA may be applied using the dummy part DMP so as to compensate for a difference between load values for the respective pixel regions PXA. To compensate for a difference between load values of scan lines in first to third pixel regions PXA1, PXA2, and PXA3, the dummy part DMP is not provided in a first peripheral region PPA1 corresponding to the first pixel region PXA1, and may be provided in a second peripheral region PPA2 corresponding to the second pixel region PXA2 and in a third peripheral region PPA3 corresponding to the third pixel region PXA3. In other embodiments, the dummy part DMP may also be provided in an additional peripheral region APA.

The display device according to the embodiment of the present disclosure may include a substrate SUB, a line unit, and second pixels PXL2_k and PXL2_k+1. The line unit may include second scan lines S2$i$−1, S2$i$, and S2$i$+1, data lines DLk and DLk+1, a light emitting control line E2$i$, second power lines PL2$k$ and PL2$k$+1, and an initialization power line IPL, which provide signals to each of the second pixels PXL2_k and PXL2_k+1.

The second scan lines S2$i$−1, S2$i$, and S2$i$+1 are provided in the second pixel region PXA2, and may provide a scan signal to the second pixels PXL2_k and PXL2_k+1. In this case, a length of the second scan lines S2$i$−1, S2$i$, and S2$i$+1 may be different from that of first scan lines (see S11 to S1$n$) provided in the first pixel region PXA1. Specifically, the length of the second scan lines S2$i$−1, S2$i$, and S2$i$+1 may be shorter than that of the first scan lines S11 to S1$n$.

The second scan lines S2$i$−1, S2$i$, and S2$i$+1 may extend in a first direction DR1 on the substrate SUB. The second scan lines S2$i$−1, S2$i$, and S2$i$+1 may include an (i−1) th second scan line S2$i$−1, an ith second scan line S2$i$, and an (i+1)th second scan line S2$i$+1, which are sequentially arranged along a second direction DR2 intersecting the first direction DR1. The scan signal may be applied to the second scan lines S2$i$−1, S2$i$, and S2$i$+1.

The light emitting control line E2$i$ may extend in the first direction DR1. The light emitting control line E2$i$, when viewed on a plane, may be located between the ith second scan line S2$i$ and the (i+1)th second scan line S2$i$+1. A light emitting control signal may be applied to the light emitting control line E2$i$.

The data lines DLk and DLk+1 may extend in the second direction DR2 on the substrate SUB. The data lines DLk and DLk+1 may include a first data line DLk and a second data line DLk+1, which are sequentially arranged along the first direction DR1. A data signal may be applied to the data lines DLk and DLk+1.

The second power lines PL2$k$ and PL2$k$+1 may extend along the second direction DR2, and may be spaced apart from the data lines DLk and DLk+1. The second power lines PL2$k$ and PL2$k$+1 may include a kth second power line PL2$k$ and a (k+1)th second power line PL2$k$+1, which are sequentially arranged along the first direction DR1. A second power source (see ELVDD of FIG. 3) may be applied to the second power lines PL2$k$ and PL2$k$+1.

The initialization power line IPL may extend along the first direction DR1, and an initialization power source (see Vint of FIG. 3) may be applied to the initialization power line IPL.

The second pixels PXL2_k and PXL2_k+1 may include a kth second pixel PXL2_k connected to the second scan lines S2$i$−1, S2$i$, and S2$i$+1 and the first data line DLk, and a (k+1)th second pixel PXL2_k+1 connected to the second scan lines S2$i$−1, S2$i$, and S2$i$+1 and the second data line DLk+1.

Each of the kth second pixel PXL2_k and the (k+1)th second pixel PXL2_k+1 may include an organic light emitting device OLED, first to seventh transistor T1 to T7, and a storage capacitor Cst.

The first transistor T1 may include a first gate electrode GE1, a first active pattern ACT1, a first source electrode SE1, a first drain electrode DE1, and a first contact line CNL1.

The second transistor T2 may include a second gate electrode GE2, a second active pattern ACT2, a second source electrode SE2, and a second drain electrode DE2.

The third transistor T3 may include a third gate electrode GE3, a third active pattern ACT3, a third source electrode SE3, and a third drain electrode DE3. The third transistor T3 may be provided in a double gate structure so as to prevent a leakage current.

The fourth transistor T4 may include a fourth gate electrode GE4, a fourth active pattern ACT4, a fourth source electrode SE4, and a fourth drain electrode DE4. The fourth transistor T4 may be provided in a double gate structure so as to prevent a leakage current.

The fifth transistor T5 may include a fifth gate electrode GE5, a fifth active pattern ACT5, a fifth source electrode SE5, and a fifth drain electrode DE5.

The sixth transistor T6 may include a sixth gate electrode GE6, a sixth active pattern ACT6, a sixth source electrode SE6, and a sixth drain electrode DE6.

The seventh transistor T7 may include a seventh gate electrode GE7, a seventh active pattern ACT7, a seventh source electrode SE7, and a seventh drain electrode DE7.

The organic light emitting device OLED may include an anode electrode AD, a cathode electrode CD located on the anode electrode AD, and an emitting layer EML located between the two electrodes AD and CD.

The storage capacitor Cst may include a lower electrode LE, and an upper electrode UE located above the lower electrode LE.

The substrate SUB may include the second pixel region PXA2 in which the second pixels PXL2_k and PXL2_k+1 are provided, and the second peripheral region PPA2 surrounding the second pixel region PXA2.

The dummy part DMP for compensating for the difference between load values for each pixel region PXA, and a first power line PL1 connected to the dummy part DMP, may be provided in the second peripheral region PPA2.

The dummy part DMP may include an eighth active pattern ACT8, extending lines ELP1 to ELP4, and a fourth contact line CNL4.

The eighth active pattern ACT8 may be provided in the same layer as the first to seventh active patterns ACT1 to ACT7 provided in the second pixels PXL2_k and PXL2_k+1. The eighth active pattern ACT8 may be formed of a semiconductor layer having portions undoped or doped with impurities. The eighth active pattern ACT8 may have a bar shape extending in the second direction DR2, and may be arranged in the first direction DR1. However, the present disclosure is not limited thereto. When viewed on a plane, the eighth active pattern ACT8 may partially overlap with the extending lines ELP1 to ELP4.

The extending lines ELP1 to ELP4 (hereinafter, referred to as extending lines ELP) may be lines formed as respective extensions of the second scan lines S2$i$−1, S2$i$, and S2$i$+1 and the light emitting control line E2$i$, which are located in the second pixel region PXA2, and which extend to the second peripheral region PPA2.

The extending lines ELP may include a first extending line ELP1 formed as the (i−1)th second scan line S2i−1 connected to the second pixels PXL2_k and PXL2_k+1 that extends to the second peripheral region PPA2, and a second extending line ELP2 formed as the ith second scan line S2i connected to the second pixels PXL2_k and PXL2_k+1 that extends to the second peripheral region PPA2. Also, the extending lines ELP may include a third extending line ELP3 formed as the light emitting control line E2i connected to the second pixels PXL2_k and PXL2_k+1 that extends to the second peripheral region PPA2, and a fourth extending line ELP4 formed as the (i+1)th second scan line S2i+1 connected to the second pixels PXL2_k and PXL2_k+1 that extends to the second peripheral region PPA2.

The first extending line ELP1 is connected to the (i−1)th second scan line S2i−1, and may be integrally formed with the (i−1)th second scan line S2i−1. The second extending line ELP2 is connected to the ith second scan line S2i, and may be integrally formed with the ith second scan line S2i. The third extending line ELP3 is connected to the light emitting control line E2i, and may be integrally formed with the light emitting control line E2i. The fourth extending line ELP4 is connected to the (i+1)th second scan line S2i+1, and may be integrally formed with the (i+1)th second scan line S2i+1. The fourth contact line CNL4 may be located on the eighth active pattern ACT8 and on the extending lines ELP to overlap with the eighth active pattern ACT8 and the extending lines ELP when viewed on a plane. The fourth contact line CNL4 may be connected to the eighth active pattern ACT8 through a fourteenth contact hole CH14.

The first power line PL1 surrounding an edge of the dummy part DMP may be provided in the second peripheral region PPA2.

The first power line PL1 may include a first metal layer MTL1, and a second metal layer MTL2 located on the first metal layer MTL1 to be connected to the first metal layer MTL1. Here, the second metal layer MTL2 may be connected to the first metal layer MTL1 through a twelfth contact hole CH12 passing through a third insulating layer IL3 to expose a portion of the first metal layer MTL1 therethrough. The first power line PL1 may be configured as a double layer including the first and second metal layers MTL1 and MTL2 so as to have a low resistance, but the present disclosure is not limited thereto. For example, the first power line PL1 may be configured as a single layer including only the first metal layer MTL1, as will be described later with reference to FIGS. 16 and 17. A first power source (see ELVSS of FIG. 3) may be applied to the first power line PL1.

In addition, a third contact line CNL3 located between the dummy part DMP and the second pixel region PXA2 may be provided in the second peripheral region PPA2. Here, the third contact line CNL3 may be spaced apart from the dummy part DMP (e.g., spaced apart at a predetermined distance).

The third contact line CNL3 may extend from one side of the second power lines PLk2 and PLk2+1 connected to the second pixels PXL2_k and PXL2_k+1 of the second pixel region PXA2. Therefore, the third contact line CNL3 may be electrically connected to the second power lines PLk2 and PLk2+1. The second power lines PLk2 and PLk2+1 connected to the second pixels PXL2_k and PXL2_k+1 closest to the dummy part DMP are connected to the third contact line CNL3, but may be not connected to the dummy part DMP. In FIG. 8, it has been illustrated that the second power lines PLk2 and PLk2+1 are connected to the third contact line CNL3 to be electrically separated from the dummy part DMP, but the present disclosure is not limited thereto. For example, the second power lines PLk2 and PLk2+1 may be provided to be electrically separated from the dummy part DMP without the third contact line CNL3.

In addition, an anode electrode AD' may be provided in the second peripheral region PPA2. Hereinafter, the anode electrode AD' located in the second peripheral region PPA2 is referred to as a conductive pattern AD' so as to prevent term confusion with the anode electrode AD located in the second pixel region PXA2.

The conductive pattern AD', when viewed on a plane, may overlap with the first power line PL1 and the dummy part DMP. The conductive pattern AD' may be located in the same layer as the anode electrode AD in the second pixel region PXA2. One side of the conductive pattern AD' may be connected to the second metal layer MTL2 of the first power line PL1 through a thirteenth contact hole CH13 passing through a protective layer PSV. As the one side of the conductive pattern AD' is connected to the second metal layer MTL2, the first power source ELVSS having the same level may be applied to the first power line PL1 and the conductive pattern AD'. The other side of the conductive pattern AD' may be connected to a second bridge pattern BRP2 through a sixteenth contact hole CH16 passing through the protective layer PSV.

The second bridge pattern BRP2 may be a component provided as a medium connecting the conductive pattern AD' and the dummy part DMP. The second bridge pattern BRP2, when viewed on a plane, may overlap with the conductive pattern AD' and the dummy part DMP. The second bridge pattern BRR2 may be connected to the fourth contact line CNL4 through a fifteenth contact hole CH15 passing through the third insulating layer IL3. One side of the second bridge pattern BRP2 may be connected to the fourth contact line CNL4 through the fifteenth contact hole CH15, and the other side of the second bridge pattern BRP2 may be connected to the conductive pattern AD' through the sixteenth contact hole CH16. The fourth contact line CNL4 and the conductive pattern AD' may be electrically connected by the second bridge pattern BRP2. Therefore, the first power source ELVSS having the same level may be applied to the conductive pattern AD' and the fourth contact line CNL4.

Here, because the fourth contact line CNL4 is connected to the eighth active pattern ACT8 through the fourteenth contact hole CH14, the first power source ELVSS may also be applied to the eighth active pattern ACT8. Therefore, in the dummy part DMP, the eighth active pattern ACT8 may overlap with the extending lines ELP with a gate insulating layer GI interposed therebetween to form a parasitic capacitor, and the extending lines ELP may overlap with the fourth contact line CNL4 with first and second insulating layers IL1 and IL2 interposed therebetween to form a parasitic capacitor. A parasitic capacitance of the parasitic capacitor of the dummy part DMP may increase a load value of the second scan lines S2i−1, S2i, and S2i+1 and/or the light emitting control line E2i, which are provided in the second pixel region PXA2. As a result, the load value of the second scan lines S2i−1, S2i, and S2i+1 may be equal or similar to that of first scan lines of a first pixel region PXA1.

In the present embodiment, the extending lines ELP include the first to fourth extending lines ELP1, ELP2, ELP3, and ELP4 respectively extending from the second scan lines S2i−1, S2i, and S2i+1 and the light emitting control line E2i, which are provided in the second pixel region PXA2, but the present disclosure is not limited thereto. For example, the extending lines ELP may be configured as separate lines located in the same layer as the upper electrode UE and the initialization power line IPL, which are provided in the second pixel region PAX2. In this case, the extending lines ELP may be respectively electrically connected to the second scan lines S2$i$−1, S2$i$, and S2$i$+1 and the light emitting control line E2$i$, which are provided in the second pixel region PXA2, through separate contact electrodes. The extending lines ELP of the dummy part DMP described above may overlap with the eighth active pattern ACT8 with the gate insulating layer GI and the first insulating layer IL1, which are interposed therebetween, to form a parasitic capacitor. As described above, the first power source ELVSS having the same level may be applied to the conductive pattern AD' and the dummy part DMP in the second peripheral region PPA2.

In general, voltages having different levels may be applied to the conductive pattern AD' and the dummy part DMP. For example, the first power source ELVSS having a low level may be applied to the conductive pattern AD', and a second power source (see ELVDD of FIG. 3) having a high level may be applied to the fourth contact line CNL4 of the dummy part DMP. As the conductive pattern AD' and the fourth contact line CNL4 overlaps with each other in the second peripheral region PPA2, there may occur a phenomenon that the dummy part DMP and the conductive pattern AD' are burnt due to a difference in voltage between the conductive pattern AD' and the fourth contact line CNL4 in the overlapping region. This may be recognized as a defect of the display device, thereby causing a decrease in yield of products.

Accordingly, in an embodiment of the present disclosure, a voltage having the same level is applied to the conductive pattern AD' and the dummy part DMP, so that it is possible to prevent a burnt defect of the conductive pattern AD' and the dummy part DMP.

The parasitic capacitance formed by the dummy part DMP may be differently set depending on a load value of scan lines and/or light emitting control lines, which are to be compensated.

In an embodiment of the present disclosure, a case where the dummy part DMP is provided as a single unit is illustrated for convenience of illustration, but the present disclosure is not limited thereto. For example, the dummy part DMP may be provided in plural numbers within a range that the area of the second peripheral region PPA2 is not enlarged.

The connection relationship between the dummy part DMP and the conductive pattern AD' may be identically applied to a third peripheral region PPA3, and therefore, a detailed description of the third peripheral region PPA3 will be omitted.

Hereinafter, a structure of the display device according to the embodiment of the present disclosure will be described along a stacking order with reference to FIGS. 8 and 9.

First, the active patterns ACT1 to ACT8 (hereinafter, referred to as active pattern ACT) may be located on the substrate SUB. The active pattern ACT may be formed of a semiconductor material.

The gate insulating layer GI may be located on the substrate SUB on which the active patterns ACT are provided.

The second scan lines S2$i$−1, S2$i$, and S2$i$+1, the light emitting control line E2$i$, the first to fourth extending lines ELP1, ELP2, ELP3, and ELP4, and the first to seventh gate electrodes GE1 to GE7 may be located on the gate insulating layer GI.

The first gate electrode GE1 may become the lower electrode LE of the storage capacitor Cst. The second and third gate electrode GE2 and GE3 may be integrally formed with the ith second scan line S2$i$, and the fifth and sixth gate electrodes GE5 and GE6 may be integrally formed with the light emitting control line E2$i$. The fourth gate electrode GE4 may be integrally formed with the (i−1)th second scan line S2$i$−1, and the seventh gate electrode GE7 may be integrally formed with the (i+1)th second scan line S2$i$+1.

The first extending line ELP1 may be connected to the (i−1)th second scan line S2$i$−1, the second extending line ELP2 may be connected to the ith second scan line S2$i$, the third extending line ELP3 may be connected to the light emitting control line E2$i$, and the fourth extending line ELP4 may be connected to the (i+1)th second scan line S2$i$+1.

The first insulating layer IL1 may be located on the substrate SUB on which the second scan lines S2$i$−1, S2$i$, and S2$i$+1, and the like are provided.

The upper electrode UE of the storage capacitor Cst and the initialization power line IPL may be located on the first insulating layer IL1. The upper electrode UE may cover the lower electrode LE. The upper electrode UE and the lower electrode LE with the first insulating layer IL1 interposed therebetween may constitute the storage capacitor Cst.

The second insulating layer IL2 may be located on the substrate SUB (e.g., on the first insulating layer IL1 on which the upper electrode UE and the like are provided).

The first and second data lines DL$k$ and DL$k$+1, the second power lines PL2$k$ and PL2$k$+1, an auxiliary connection line AUX, the first to fourth contact lines CNL1, CNL2, CNL3, and CNL4, and the first metal layer MTL1 may be located on the second insulating layer IL2.

The data line DL$k$ or DL$k$+1 may be connected to the second source electrode SE2 of a corresponding second pixel PXL2_$k$ or PXL2_$k$+1 through a sixth contact hole CH6 sequentially passing through the gate insulating layer GI and the first and second insulating layers IL1 and IL2.

The second power line PL2$k$ or PL2$k$+1 may be connected to the fifth source electrode SE5 of a corresponding second pixel PXL2_$k$ or PXL2_$k$+1 through a fifth contact hole CH5 sequentially passing through the gate insulating layer GI and the first and second insulating layers IL1 and IL2. Also, the second power line PL2$k$ or PL2$k$+1 may be connected to the upper electrode UE of a corresponding second pixel PXL2_$k$ or PXL2_$k$+1 through third and fourth contact holes CH3 and CH4 passing through the second insulating layer IL2.

The auxiliary connection line AUX may be connected to the initialization power line IPL through an eighth contact hole CH8 passing through the second insulating layer IL2. Also, the auxiliary connection line AUX may be connected to the seventh drain electrode DE7 of a corresponding second pixel PXL2_$k$ or PXL2_$k$+1 through a ninth contact hole CH9 sequentially passing through the gate insulating layer GI and the first and second insulating layers IL1 and IL2.

The first contact line CNL1 may be connected to the first gate electrode GE1 of a corresponding second pixel PXL2_$k$ or PXL2_$k$+1 through a first contact hole CH1 sequentially passing through the first and second insulating layers IL1 and IL2. Also, the first contact line CNL1 may be connected to each of the third and fourth drain electrodes DE3 and DE4 of a corresponding second pixel PXL2_$k$ or PXL2_$k$+1 through a second contact hole CH2 sequentially passing through the gate insulating layer GI and the first and second insulating layers IL1 and IL2.

The second contact line CNL2 may be connected to each of the sixth drain electrode DE6 and the seventh source electrode SE7 of a corresponding second pixel PXL2_$k$ or PXL2_$k$+1 through a seventh contact hole CH7 sequentially passing through the gate insulating layer GI and the first and second insulating layers IL1 and IL2.

The third contact line CNL3 may be integrally formed with the second power lines PL2$k$ and PL2$k$+1 to be connected to the second power lines PL2$k$ and PL2$k$+1.

The fourth contact line CNL4 may be connected to the eighth active pattern ACT8 through the fourteenth contact hole CH14 sequentially passing through the gate insulating layer GI and the first and second insulating layers IL1 and IL2.

The first metal layer MTL1 may be spaced apart from the fourth contact line CNL4 (e.g., spaced at a predetermined distance).

The third insulating layer IL3 may be located on the substrate SUB (e.g., on the second insulating layer IL2 on which the data lines DL$k$ and DL$k$+1 and the like are provided).

A first bridge pattern BRP1, the second bridge pattern BRP2, and the second metal layer MTL2 may be located on the third insulating layer IL3.

The first bridge pattern BRP1 may be connected to the second contact line CNL2 through a tenth contact hole CH10 passing through the third insulating layer IL3.

The second bridge pattern BRP2 may be connected to the fourth contact line CNL4 through the fifteenth contact hole CH15.

The second metal layer MTL2 may be connected to the first metal layer MTL1 through the twelfth contact hole CH12.

The protective layer PSV may be located on the substrate SUB (e.g., on the third insulating layer IL3 on which the first bridge pattern BRP1 and the like are provided).

The anode electrode AD and the conductive pattern AD' may be located on the protective layer PSV.

The anode electrode AD may be connected to the first bridge pattern BRP1 through an eleventh contact hole CH11 passing through the protective layer PSV. The anode electrode AD may be connected to each of the sixth drain electrode DE6 and the seventh source electrode SE7 of a corresponding second pixel PXL2_$k$ or PXL2_$k$+1 through the first bridge pattern BRP1 and the second contact line CNL2.

The conductive pattern AD' may be connected to the second bridge pattern BRP2 through the sixteenth contact hole CH16. Also, the conductive pattern AD' may be connected to the second metal layer MTL2 through the thirteenth contact hole CH13. The conductive pattern AD' may be connected to the fourth contact line CNL4 through the second bridge pattern BRP2. As a result, the fourth contact line CNL4 and the second metal layer MTL2 may be electrically connected to each other through the conductive pattern AD' and the second bridge pattern BRP2.

A pixel defining layer PDL defining the second pixel region PXA2 may be located on the substrate SUB (e.g., on the protective layer PSL on which the anode electrode AD and the like are provided).

The emitting layer EML may be provided in the second pixel region PXA2 surrounded by the pixel defining layer PDL, and the cathode electrode CD may be located on the emitting layer EML.

An encapsulation layer SLM covering the cathode electrode CD may be provided over the cathode electrode CD. The encapsulation layer SLM may prevent oxygen and moisture from penetrating into the organic light emitting device OLED. The encapsulation layer SLM may include an inorganic layer. The inorganic layer may include at least one selected from the group consisting of silicon oxide, silicon nitride, silicon oxynitride, aluminum oxide, titanium oxide, zirconium oxide, and tin oxide.

FIGS. 10 to 15 are layout views schematically illustrating the second pixels, the dummy part, the first power line, and the anode electrode, which are shown in FIG. 8, for each layer.

Figure 10:
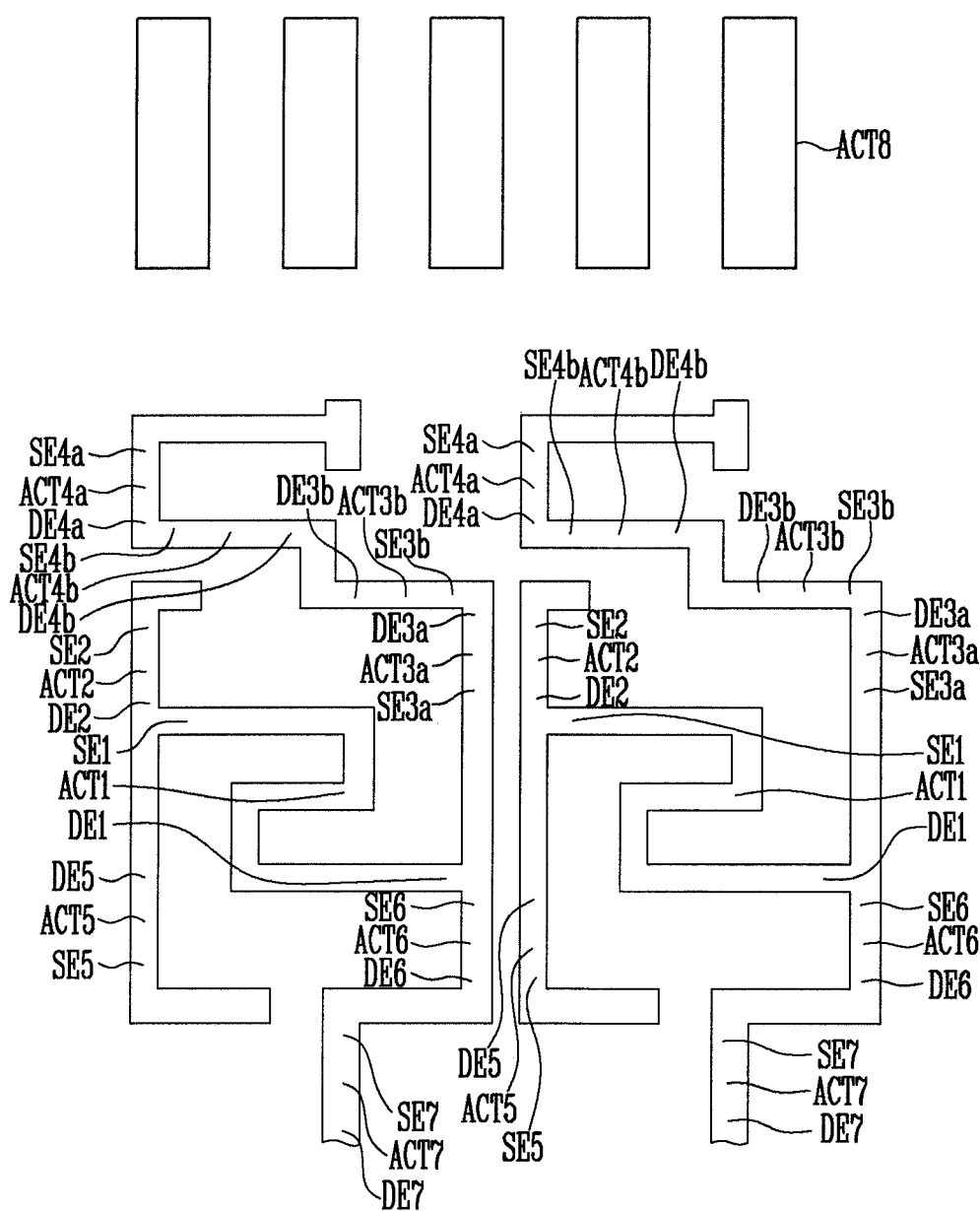
FIGS. 10 to 15 are layout views schematically illustrating second pixels, a dummy part, a first power line, and an anode electrode, which are shown in FIG. 8, for each layer.
Figure 11:
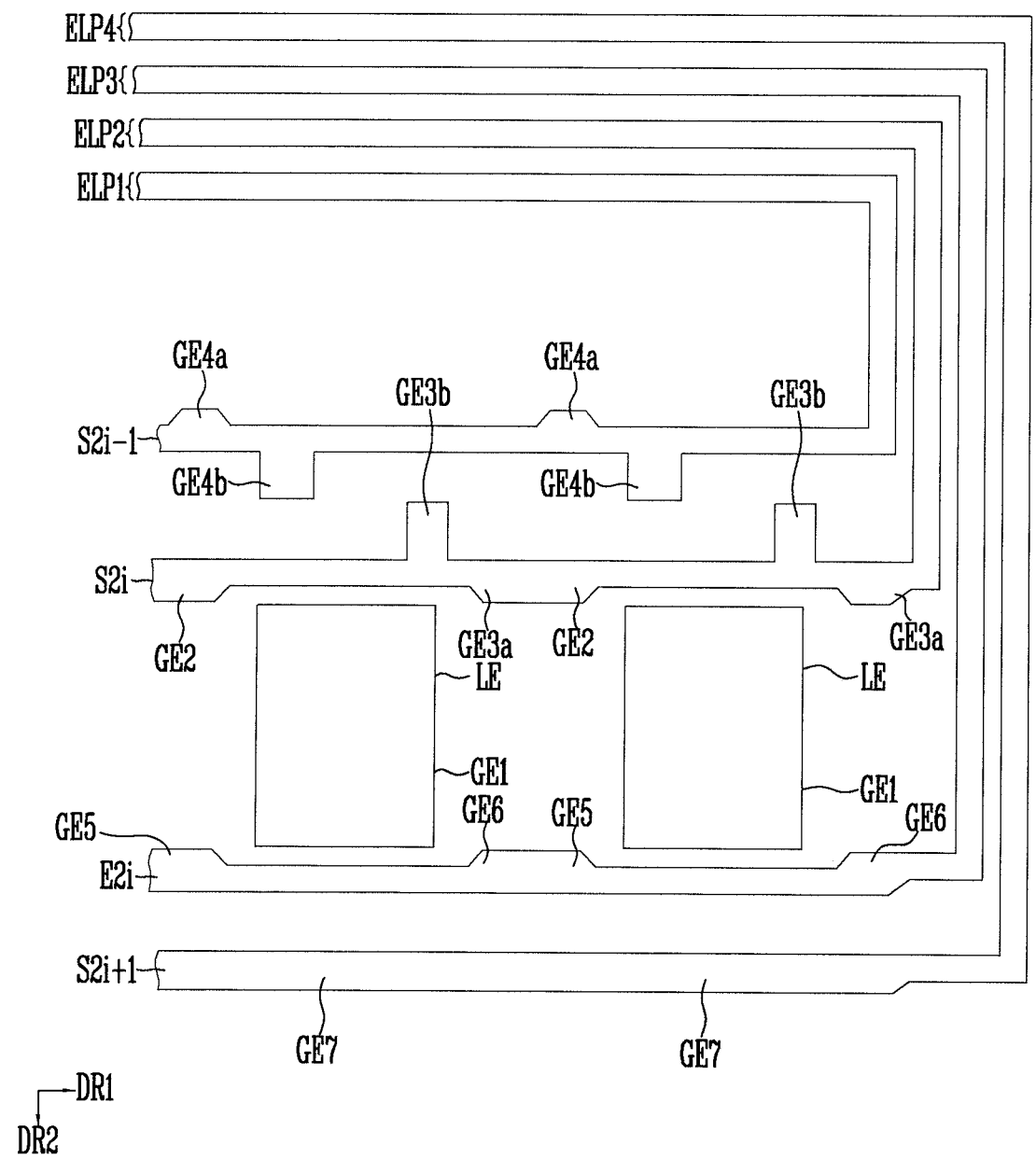

First, referring to FIGS. 8 and 10, first to eighth active patterns ACT1 to ACT8 may be located on a substrate (see SUB of FIG. 9). The first to eighth active patterns ACT1 to ACT8 may be formed in the same layer through the same process.

One end of the first active pattern ACT1 may be connected to a first source electrode SE1, and the other end of the first active pattern ACT1 may be connected to the first drain electrode DE1. One end of the second active pattern ACT2 may be connected to a second source electrode SE2, and the other end of the second active pattern ACT2 may be connected to a second drain electrode DE2. One end of the third active pattern ACT3 may be connected to a third source electrode SE3, and the other end of the third active pattern ACT3 may be connected to a third drain electrode DE3. One end of the fourth active pattern ACT4 may be connected to a fourth source electrode SE4, and the other end of the fourth active pattern ACT4 may be connected to a fourth drain electrode DE4. One end of the fifth active pattern ACT5 may be connected to a fifth source electrode SE5, and the other end of the fifth active pattern ACT5 may be connected to a fifth drain electrode DE5. One end of the sixth active pattern ACT6 may be connected to a sixth source electrode SE6, and the other end of the sixth active pattern ACT6 may be connected to a sixth drain electrode DE6. One end of the seventh active pattern ACT7 may be connected to a seventh source electrode SE7, and the other end of the seventh active pattern ACT7 may be connected to a seventh drain electrode DE7.

Referring to FIGS. 8 to 11, second scan lines S2$i$−1, S2$i$, and S2$i$+1, a light emitting control line E2$i$, a lower electrode LE, and first to fourth extending lines ELP1, ELP2, ELP3, and ELP4 may be located on the first to eighth active patterns ACT1 to ACT8 with a gate insulating layer (see GI of FIG. 9) interposed therebetween. The second scan lines S2$i$−1, S2$i$, and S2$i$+1, the light emitting control line E2$i$, the lower electrode LE, and the first to fourth extending lines ELP1, ELP2, ELP3, and ELP4 may be formed in the same layer through the same process.

Here, the second scan lines S2$i$−1, S2$i$, and S2$i$+1 may include an (i−1)th second scan line S2$i$−1, an ith second scan line S2$i$, and an (i+1)th second scan line S2$i$+1. A fourth gate electrode GE4 may be provided to the (i−1)th second scan line S2$i$−1, second and third gate electrodes GE2 and GE3 may be provided to the ith second scan line S2$i$, and a seventh gate electrode GE7 may be provided to the (i+1)th second scan line S2$i$+1.

A first gate electrode GE1 may be provided to the lower electrode LE. Fifth and sixth gate electrodes GE5 and GE6 may be provided to the light emitting control line E2$i$.

The first extending line ELP1 may extend from one side of the (i−1)th second scan line S2$i$−1, the second extending line ELP2 may extend from one side of the ith second scan line S2$i$, the third extending line ELP3 may extend from one side of the light emitting control line E2*i*, and the fourth extending line ELP4 may extend from one side of the (i+1)th second scan line S2*i*+1.

Figure 12:
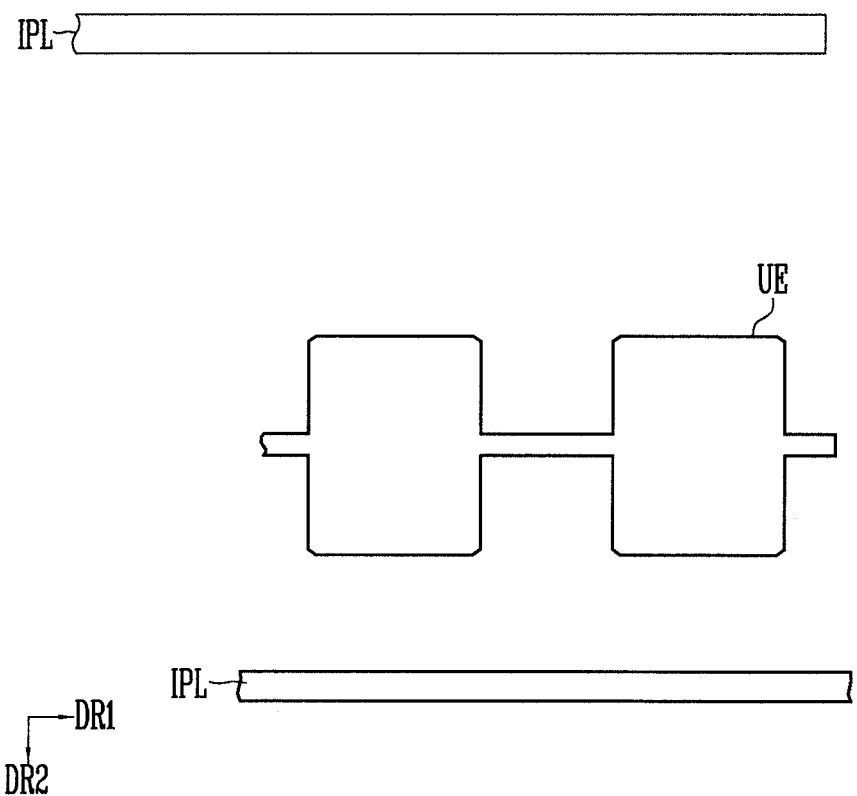

Referring to FIGS. 8 and 12, an initialization power line IPL and an upper electrode UE may be located on the second scan lines S2*i*−1, S2*i*, and S2*i*+1, the light emitting control line E2*i*, the lower electrode LE, and the first to fourth extending lines ELP1, ELP2, ELP3, and ELP4 with a first insulating layer (see IL1 of FIG. 9) interposed therebetween. The initialization power line IPL and the upper electrode UE may be formed in the same layer through the same process.

Figure 13:
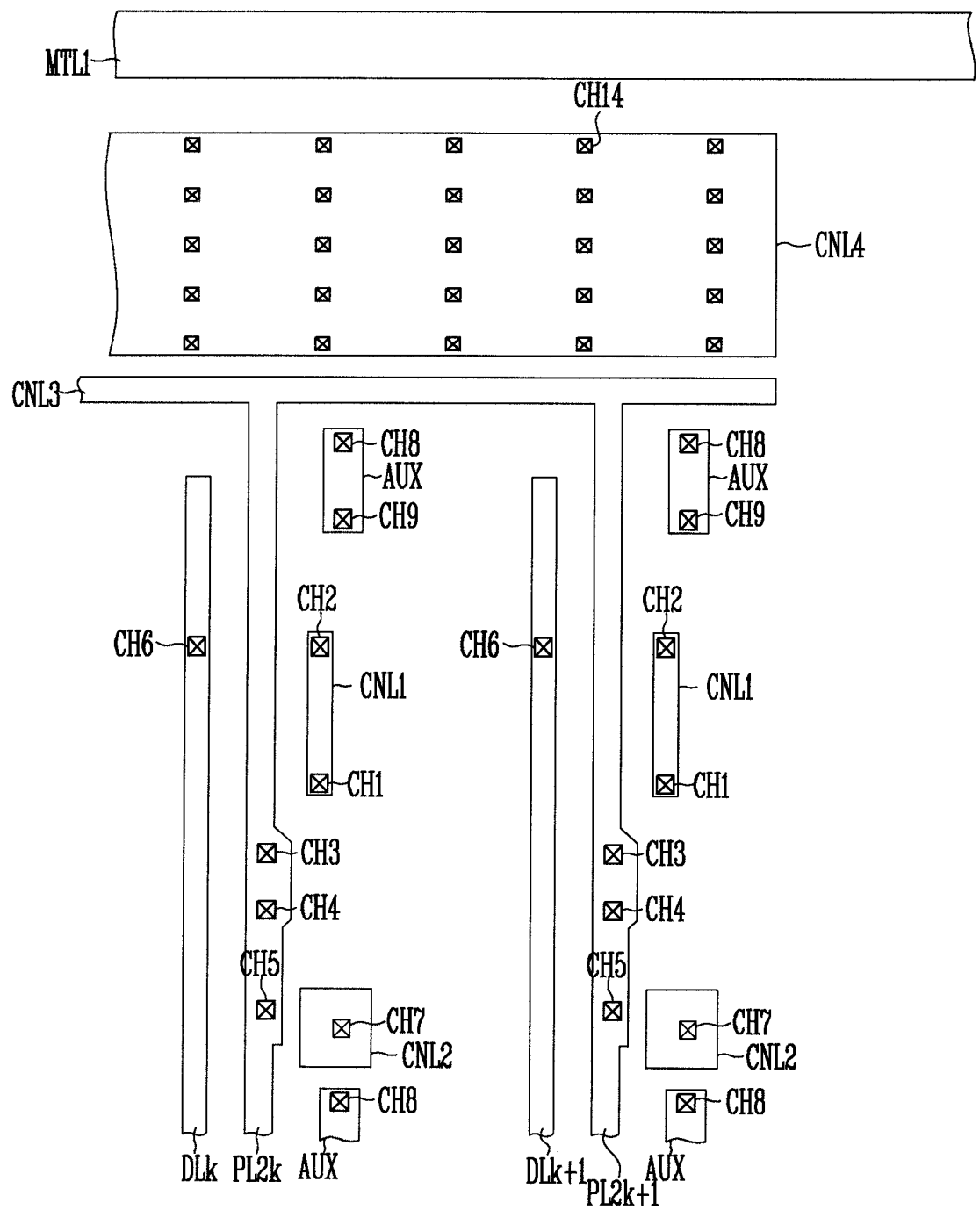

Referring to FIGS. 8 and 13, first and second data lines DL*k* and DL*k*+1, second power lines PL2*k* and PL2*k*+1, an auxiliary connection line AUX, first to fourth contact lines CNL1, CNL2, CNL3, and CNL4, and a first metal layer MTL1 may be located above the initialization power line IPL and the upper electrode UE with a second insulating layer (see IL2 of FIG. 9) interposed therebetween.

Each of the first and second data lines DL*k* and DL*k*+1 may be connected to a second source electrode (see SE2) of a corresponding pixel PXL2_*k* or PXL2_*k*+1 through a sixth contact hole CH6.

The second power lines PL2*k* and PL2*k*+1 may be connected to the upper electrode UE through third and fourth contact holes CH3 and CH4. Also, each of the second power lines PL2*k* and PL2*k*+1 may be connected to a fifth source electrode SE5 of a corresponding pixel PXL2_*k* or PXL2_*k*+1 through a fifth contact hole CH5.

The auxiliary connection line AUX may be connected to the initialization power line IPL through an eighth contact hole CH8. Also, the auxiliary connection line AUX may be connected to a seventh drain electrode DE7 of a corresponding pixel PXL2_*k* or PXL2_*k*+1 through a ninth contact hole CH9.

The first contact line CNL1 may be connected to a first gate electrode GE1 of a corresponding pixel PXL2_*k* or PXL2_*k*+1 through a first contact hole CH1. Also, the first contact line CNL1 may be connected to each of third and fourth drain electrodes DE3 and DE4 of a corresponding pixel PXL2_*k* or PXL2_*k*+1 through a second contact hole CH2.

The second contact line CNL2 may be connected to each of a sixth drain electrode DE6 and a seventh source electrode SE7 of a corresponding pixel PXL2_*k* or PXL2_*k*+1 through a seventh contact hole CH7.

The third contact line CNL3 may be integrally provided with the second power lines PL2*k* and PL2*k*+1 to be connected to the second power lines PL2*k* and PL2*k*+1.

The fourth contact line CNL4 may be connected to the eighth active pattern ACT8 through a fourteenth contact hole CH14.

Figure 14:
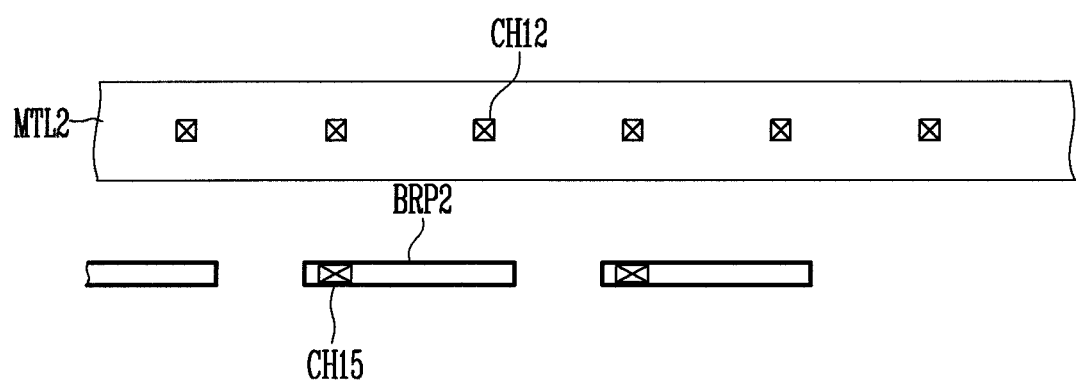
Figure 14:

Referring to FIGS. 8 and 14, first and second bridge patterns BRP1 and BRP2 and a second metal layer MTL2 may be located above the first and second data lines DL*k* and DL*k*+1, the second power lines PL2*k* and PL2*k*+1, the auxiliary connection line AUX, the first to fourth contact lines CNL1, CNL2, CNL3, and CNL4, and the first metal layer MTL1 with a third insulating layer (see IL3 of FIG. 9) interposed therebetween.

The first bridge pattern BRP1 may be connected to a second contact line CNL2 of a corresponding pixel PXL2_*k* or PXL2_*k*+1 through a tenth contact hole CH10.

The second bridge pattern BRP2 may be connected to a fourth contact line CNL4 of a corresponding pixel PXL2_*k* or PXL2_*k*+1 through a fifteenth contact hole CH15.

The second metal layer MTL2 may be connected to the first metal layer through a twelfth contact hole CH12.

Figure 15:
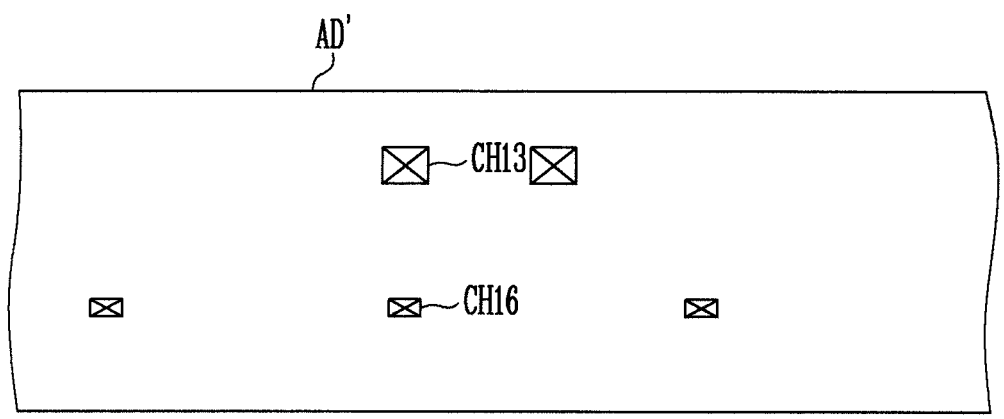
Figure 15:
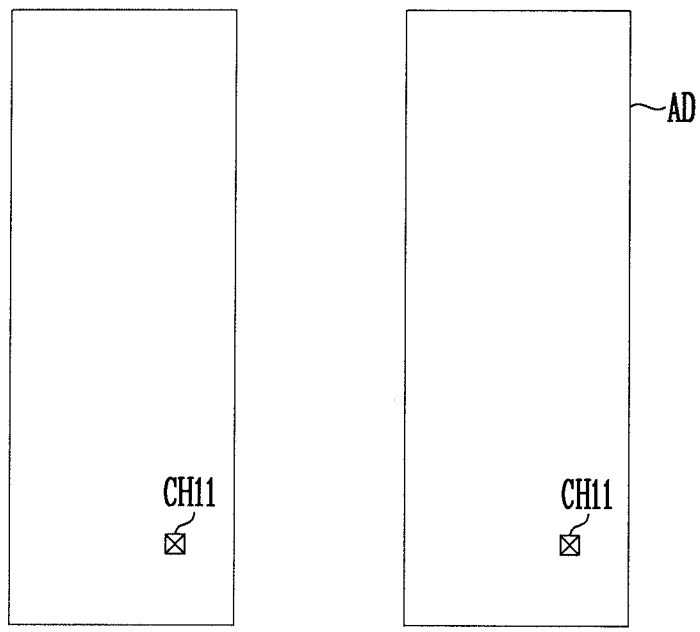

Referring to FIGS. 8 and 15, an anode electrode AD and a conductive pattern AD' may be located above the first and second bridge patterns BRP1 and BRP2 and the second metal layer MTL2 with a protective layer (see PSV of FIG. 9) therebetween.

The anode electrode AD may be connected to the first bridge pattern BRP1 through an eleventh contact hole CH11.

The conductive pattern AD' may be connected to the second metal layer MTL2 through a thirteenth contact hole CH13. Also, the conductive pattern AD' may be connected to the second bridge pattern BRP2 through a sixteenth contact hole CH16.

Figure 16:
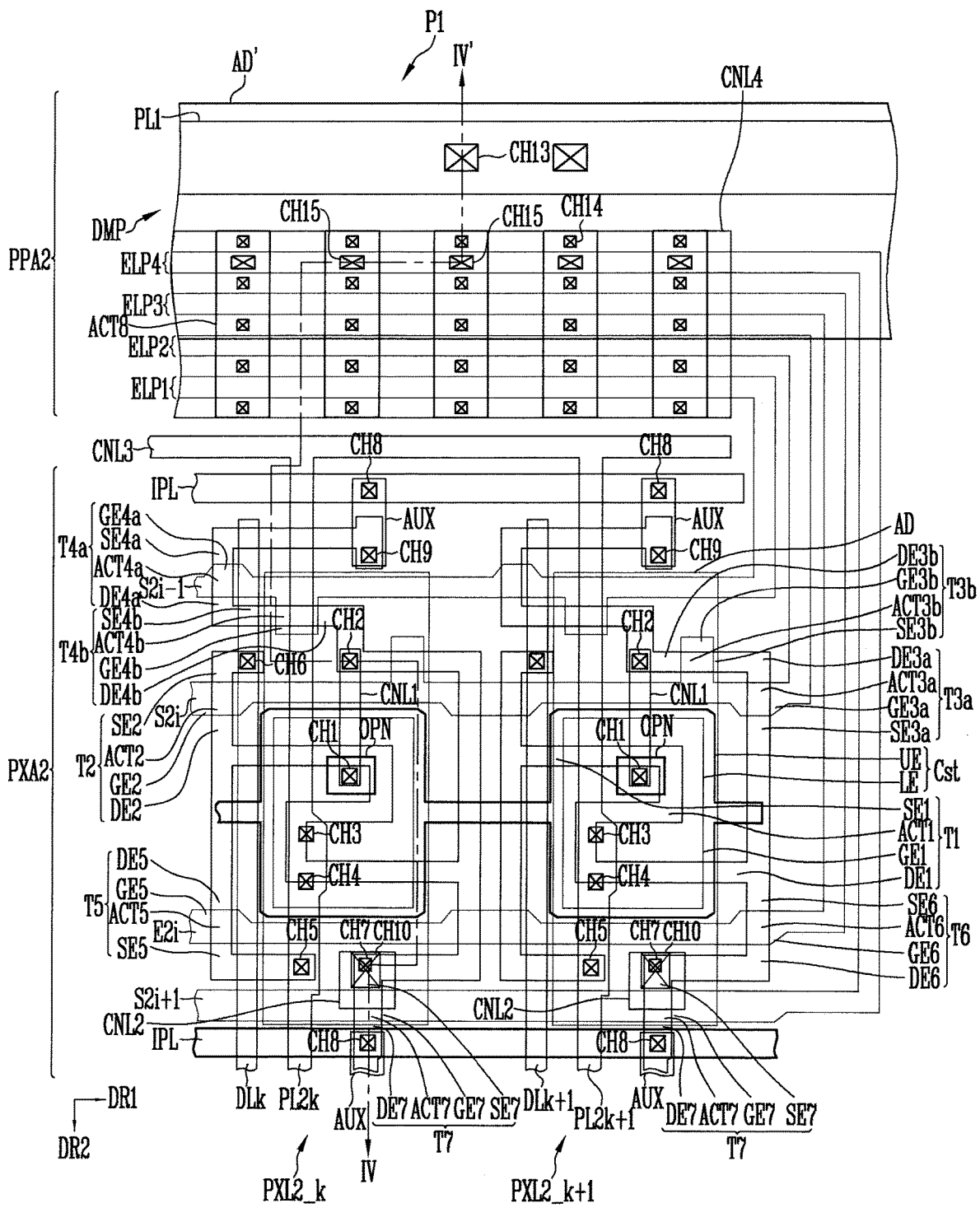
FIG. 16 illustrates a portion of a display device according to another embodiment of the present disclosure, which is a plan view corresponding to P1 of FIG. 1.
Figure 17:
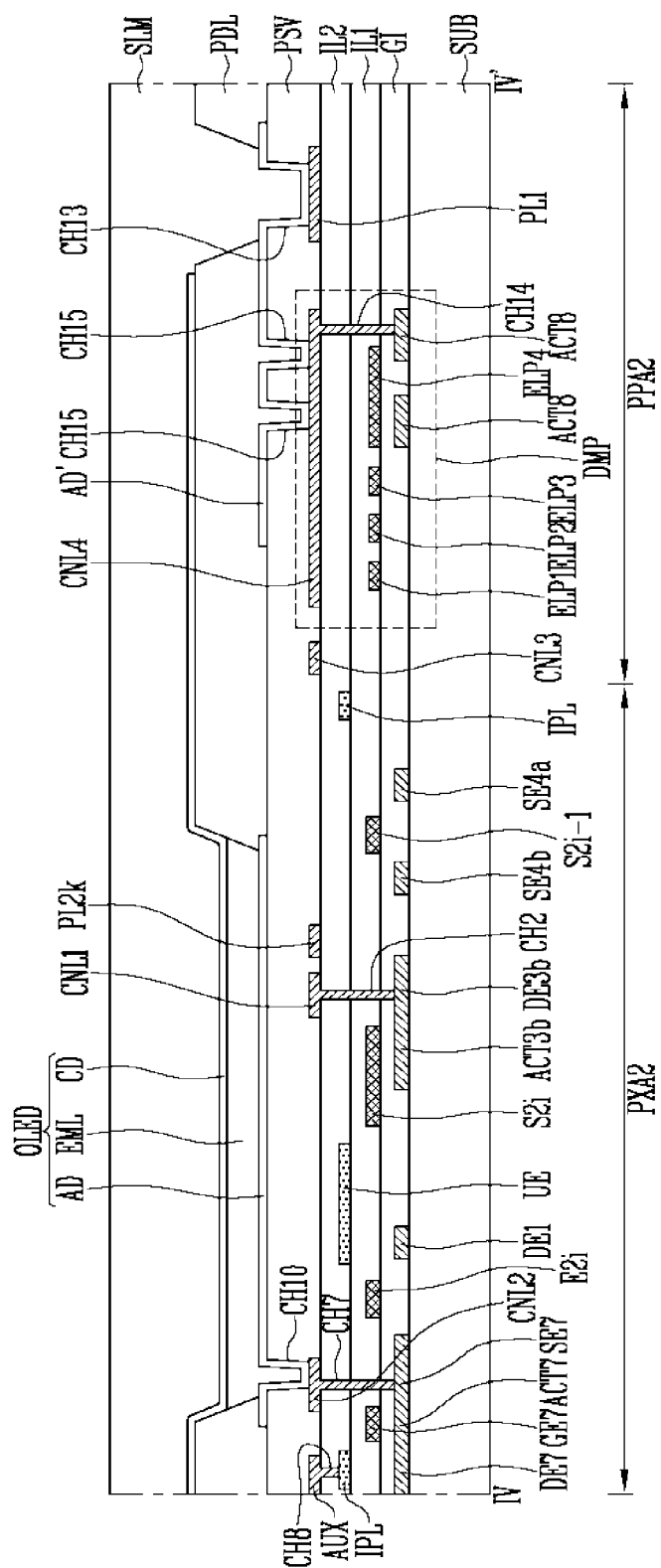
FIG. 17 is a sectional view taken along the line IV-IV' of FIG. 16.

FIG. 16 illustrates a portion of a display device according to another embodiment of the present disclosure, which is a plan view corresponding to P1 of FIG. 1. FIG. 17 is a sectional view taken along the line IV-IV' of FIG. 16. In FIGS. 16 and 17, differences from the above-described embodiment will be mainly described to avoid redundancy. Portions not particularly described in the other embodiment of the present disclosure follow the above-described embodiment. In addition, identical reference numerals refer to identical components, and similar reference numerals refer to similar components.

Referring to FIGS. 1, 16, and 17, the display device according to the other embodiment of the present disclosure may include a substrate SUB, a line unit, and second pixels PXL2_*k* and PXL2_*k*+1.

The substrate SUB may include a second pixel region PXA2 in which the second pixels PXL2_*k* and PXL2_*k*+1 are provided, and a second peripheral region PPA2 provided at the periphery of the second pixel region PXA2.

The line unit may include second scan lines S2*i*−1, S2*i*, and S2*i*+1, first and second data lines DL*k* and DL*k*+1, a light emitting control line E2*i*, second power lines PL2*k* and PL2*k*+1, and an initialization power line IPL, which provide signals to each of the second pixels PXL2_*k* and PXL2_*k*+1.

The second pixels PXL2_*k* and PXL2_*k*+1 may include a kth second pixel PXL2_*k* connected to the second scan lines S2*i*−1, S2*i*, and S2*i*+1 and the first data line DL*k*, and a (k+1)th second pixel PXL2_*k*+1 connected to the second scan lines S2*i*−1, S2*i*, and S2*i*+1 and the second data line DL*k*+1.

Each of the kth second pixel PXL2_*k* and the (k+1)th second pixel PXL2_*k*+1 may include an organic light emitting device OLED, first to seventh transistors T1 to T7, and a storage capacitor Cst.

A dummy part DMP, a first power line PL1, and a conductive pattern AD' may be provided in the second peripheral region PPA2.

The dummy part DMP is used to compensate for a difference between load values for each pixel region PXA, and may include an eighth active pattern ACT5, extending lines ELP1 to ELP4, and a fourth contact line CNL4.

The extending lines ELP1, ELP2, ELP3, and ELP4 (hereinafter, referred to as extending lines ELP) may be lines formed as respective extensions of the second scan lines S2*i*−1, S2*i*, and S2*i*+1 and the light emitting control line E2*i*, which are located in the second pixel region PXA2, and which extend to the second peripheral region PPA2.

The fourth contact line CNL4 may be located on the eighth active pattern ACT8 and the extending lines ELP, to overlap with the eighth active pattern ACT8 and the extending lines ELP when viewed on a plane. The fourth contact line CNL4 may be connected to the eighth active pattern ACT8 through a fourteenth contact hole CH14.

The first power line PL1, when viewed on a plane, may be located at an edge of the dummy part DMP and may be spaced apart from the dummy part DMP at a predetermined distance. The first power line PL1 may be configured as a single layer, and a first power source (see ELVSS of FIG. 3) may be applied to the first power line PL1.

The conductive pattern AD', when viewed on a plane, may overlap with the first power line PL1 and the dummy part DMP. The conductive pattern AD' may be located in the same layer as an anode electrode AD located in the second pixel region PXA2. One side of the conductive pattern AD' may be connected to the first power line PL1 through a thirteenth contact hole CH13 passing through a protective layer PSV. The other side of the conductive pattern AD' may be connected to the fourth contact line CNL4 through a fifteenth contact hole CH15 passing through the protective layer PSV. Here, the fifteenth contact hole CH15, when viewed on a plane, may be provided in the protective layer PSV without overlapping with the fourteenth contact hole CH14, but the present disclosure is not limited thereto. For example, the fifteenth contact hole CH15, when viewed on a plane, may be provided in the protective layer PSV to overlap with the fourteenth contact hole CH14.

Therefore, the first power line PL1 may be connected to the fourth contact line CNL4 through the conductive pattern AD'. As a result, the first power line PL1 may be connected to the dummy part DMP.

Because the fourth contact line CNL4 is connected to the eighth active pattern ACT8, the first power source ELVSS may also be applied to the eighth active pattern ACT8. Therefore, in the dummy part DMP, the eighth active pattern ACT8 may overlap with the extending lines ELP with a gate insulating layer GI interposed therebetween to form a parasitic capacitor, and the extending lines ELP may overlap with the fourth contact line CNL4 with first and second insulating layers IL1 and IL2 interposed therebetween to form a parasitic capacitor. A parasitic capacitance of the parasitic capacitor of the dummy part DMP may increase a load value of the second scan lines S2$i$−1, S2$i$, and S2$i$+1 and/or the light emitting control line E2$i$, which are provided in the second pixel region PXA2. As a result, the load value of the second scan lines S2$i$−1, S2$i$, and S2$i$+1 may be equal or similar to that of first scan lines of a first pixel region PXA1.

As described above, the first power source ELVSS having the same level may be applied to the conductive pattern AD' and the dummy part DMP in the second peripheral region PPA2.

Hereinafter, a structure of the display device according to the other embodiment of the present disclosure will be described along a stacking order with reference to FIGS. 16 and 17.

First, first to seventh active patterns ACT1 to ACT7 and the eighth active pattern ACT8 may be located on the substrate SUB.

The gate insulating layer GI may be located on the first to eighth active patterns ACT1 to ACT8.

The second scan line S2$i$−1, S2$i$, and S2$i$+1, the light emitting control line E2$i$, the extending lines ELP, first to seventh gate electrodes GE1 to GE7, and a lower electrode LE of a storage capacitor Cst may be located on the gate insulating layer GI.

The first insulating layer IL1 may be located on the substrate SUB on which the second scan line S2$i$−1, S2$i$, and S2$i$+1 and the like are provided.

An upper electrode UE of the storage capacitor Cst and the initialization power line IPL may be located on the first insulating layer IL1. The upper electrode UE may cover the lower electrode LE. The upper electrode UE above the lower electrode LE with the first insulating layer IL1 interposed therebetween may constitute the storage capacitor Cst.

The second insulating layer IL2 may be located on the substrate SUB on which the upper electrode UE and the like are provided.

The first and second data lines DL$k$ and DL$k$+1, the second power lines PL2$k$ and PL2$k$+1, an auxiliary connection line AUX, first to third contact lines CNL1, CNL2, and CNL3, the fourth contact line CNL4, and the first power line PL1 may be located on the second insulating layer IL2.

The protective layer PSV may be located on the substrate SUB on which the first and second data lines DL$k$ and DL$k$+1 and the like are provided.

An anode electrode AD and the conductive pattern AD', which are located in the second pixel region PXA2, may be located on the protective layer PSV.

The anode electrode AD may be connected to the second contact line CNL2 through a tenth contact hole CH10 passing through the protective layer PSV. The anode electrode AD may be connected to a sixth drain electrode DE6 and a seventh source electrode SE7 of a corresponding second pixel PXL2_$k$ or PXL2_$k$+1 through the second contact line CNL2.

The conductive pattern AD' may be connected to the fourth contact line CNL4 through the fifteenth contact hole CH15. Also, the conductive pattern AD' may be connected to the first power line PL1 through a thirteenth contact hole CH13. As a result, the fourth contact line CNL4 and the first power line PL1 may be electrically connected to each other through the conductive pattern AD'.

A pixel defining layer PDL defining the second pixel region PXA2 may be located on the substrate SUB on which the anode electrode AD and the conductive pattern AD' are provided.

An emitting layer EML may be provided in the second pixel region PXA2 surrounded by the pixel defining layer PDL, and a cathode electrode CD may be located on the emitting layer EML.

An encapsulation layer SLM covering the cathode electrode CD may be provided over the cathode electrode CD.

Figure 18:
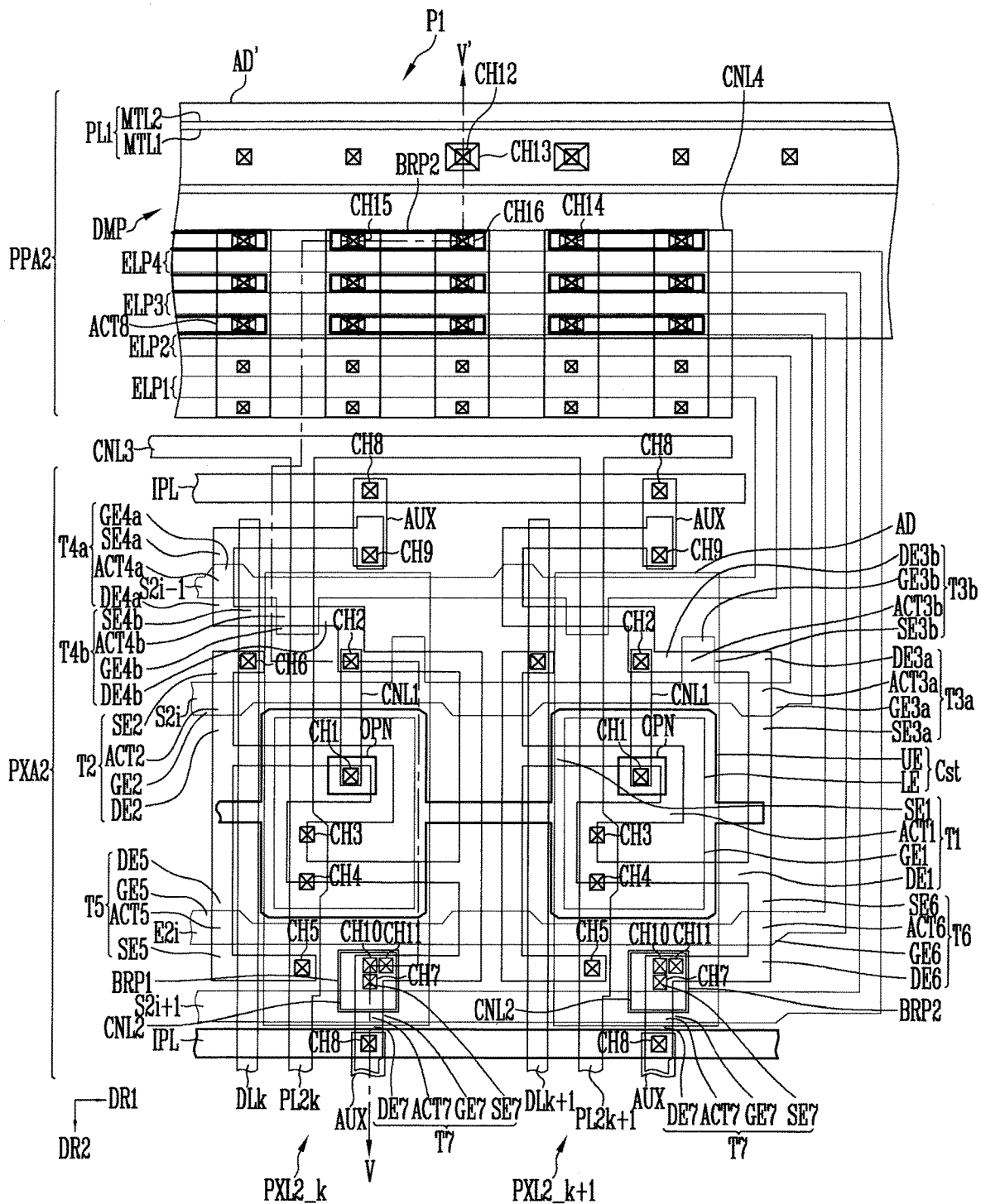
FIG. 18 illustrates a portion of a display device according to still another embodiment of the present disclosure, which is a plan view corresponding to P1 of FIG. 1.
Figure 19:
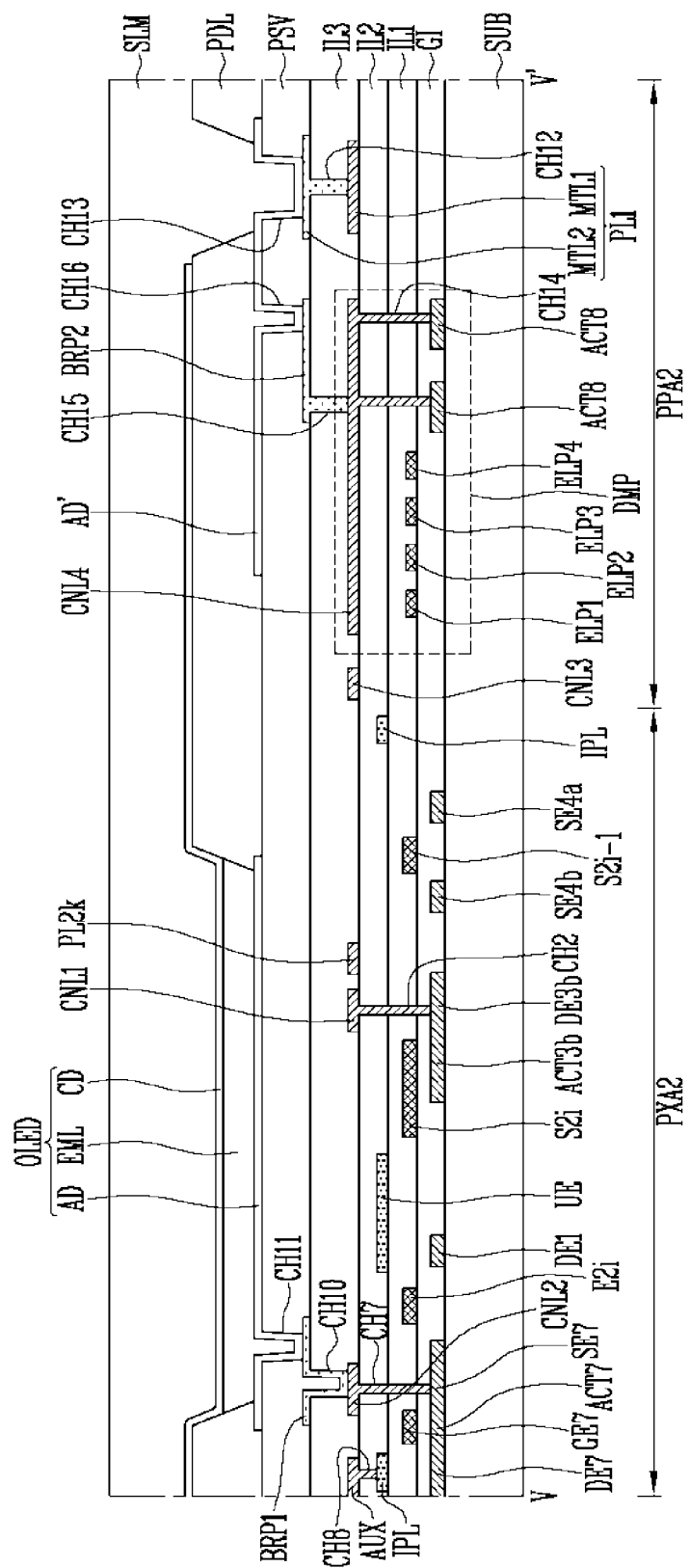
FIG. 19 is a sectional view taken along the line V-V' of FIG. 18.

FIG. 18 illustrates a portion of a display device according to still another embodiment of the present disclosure, which is a plan view corresponding to P1 of FIG. 1. FIG. 19 is a sectional view taken along the line V-V of FIG. 18. In FIGS. 18 and 19, differences from the above-described display device according the embodiment will be mainly described to avoid redundancy. Portions not particularly described in the still another embodiment of the present disclosure follow the above-described display device according to the embodiment. In addition, identical reference numerals refer to identical components, and similar reference numerals refer to similar components.

Referring to FIGS. 1, 18, and 19, the display device according to the still another embodiment of the present disclosure may include a substrate SUB, a line unit, and second pixels PXL2_$k$ and PXL2_$k$+1.

The substrate SUB may include a second pixel region PXA2 in which the second pixels PXL2_$k$ and PXL2_$k$+1 are provided, and a second peripheral region PPA2 provided at the periphery of the second pixel region PXA2.

Here, the second pixels PXL2_$k$ and PXL2_$k$+1 may include a kth second pixel PXL2_$k$ connected to the second scan lines S2$i$−1, S2$i$, and S2$i$+1 and the first data line DL$k$, and a (k+1)th second pixel PXL2_$k$+1 connected to the second scan lines S2$i$−1, S2$i$, and S2$i$+1 and the second data line DL$k$+1. Each of the kth second pixel PXL2_$k$ and the (k+1)th second pixel PXL2_$k$+1 may include an organic light emitting device OLED, first to seventh transistors T1 to T7, and a storage capacitor Cst.

A dummy part DMP, a first power line PL1, and a conductive pattern AD' may be provided in the second peripheral region PPA2.

The dummy part DMP is used to compensate for differences between load values for each pixel region PXA, and may include an eighth active pattern ACT8, first to fourth extending lines ELP1 to ELP4, and a fourth contact line CNL4.

The eighth active pattern ACT8 may be provided in the same layer as first to seventh active patterns ACT1 to ACT7 provided in first to seventh transistors T1 to T7 of the second pixels PXL2_$k$ and PXL2_$k$+1.

The first to fourth extending lines ELP1 to ELP4 may be lines formed as respective extensions of the second scan lines S2$i$−1, S2$i$, and S2$i$+1 and the light emitting control line E2$i$, which are located in the second pixel region PXA2, and which extend to the second peripheral region PPA2.

The fourth contact line CNL4 may be located on the eighth active pattern ACT8 and the first to fourth extending lines ELP1 to ELP4 to overlap with the eighth active pattern ACT8 and the first to fourth extending lines ELP1 to ELP4 when viewed on a plane. The fourth contact line CNL4 may be connected to the eighth active pattern ACT8 through a fourteenth contact hole CH14.

The first power line PL1 may include a first metal layer MTL1, and a second metal layer MTL2 located on the first metal layer MTL1 to be connected to the first metal layer MTL1. Here, the second metal layer MTL2 may be connected to the first metal layer MTL1 through a twelfth contact hole CH12 passing through a third insulating layer IL3 to expose a portion of the first metal layer MTL1 therethrough.

The conductive pattern AD', when viewed on a plane, may overlap with the first power line IPL1 and the dummy part DMP. One side of the conductive pattern AD' may be connected to the second metal layer MTL2 of the first power line PL1 through a thirteenth contact hole CH13 passing through a protective layer PSV. The other side of the conductive pattern AD' may be connected to a second bridge pattern BRP2 through a sixteenth contact hole CH16 passing through the protective layer PSV.

As the one side of the conductive pattern AD' is connected to the second metal layer MTL2, the first power source ELVSS having the same level may be applied to the first power line PL1 and the conductive pattern AD'.

Here, the protective layer PSV may be patterned through a mask process or the like such that, when viewed on a plane, the thirteenth contact hole CH13 corresponds to the twelfth contact hole CH12, and the sixteenth contact hole CH16 corresponds to the fourteenth contact hole CH14. Therefore, the thirteenth contact hole CH13 may be located to correspond to an upper portion of the twelfth contact hole CH12, and the sixteenth contact hole CH16 may be located to correspond to an upper portion of the fourteenth contact hole CH14. As a result, the thirteenth contact hole CH13, when viewed on a plane, may overlap with the twelfth contact hole CH12, and the sixteenth contact hole CH16, when viewed on a plane, may overlap with the fourteenth contact hole CH14.

In an embodiment of the present disclosure, a case where the thirteenth contact hole CH13 overlaps with the twelfth contact hole CH12, and where the sixteenth contact hole CH16 overlaps with the fourteenth contact hole CH14 has been illustrated for convenience of description, but the present disclosure is not limited thereto. For example, the thirteenth contact hole CH13, when viewed on a plane, may be provided in the protective layer PSV to not overlap with the twelfth contact hole CH12, but instead to be located adjacent at least one side of the twelfth contact hole CH12. In addition, the sixteenth contact hole CH16 may be provided in the protective layer PSV to not overlap with the fourteenth contact hole CH14, but instead to be located adjacent to at least one side of the sixteenth contact hole CH16.

The second bridge pattern BRP2 may be a component provided as a medium connecting the conductive pattern AD' and the dummy part DMP. The second bridge pattern BRP2, when viewed on a plane, may overlap with the conductive pattern AD' and the dummy part DMP. The second bridge pattern BRP2 may be connected to the fourth contact line CNL4 through a fifteenth contact hole CH15 passing through the third insulating layer IL3. One side of the second bridge pattern BRP2 may be connected to the fourth contact line CNL4 through the fifteenth contact hole CH15, and the other side of the second bridge pattern BRP2 may be connected to the conductive pattern AD' through the sixteenth contact hole CH16.

The fourth contact line CNL4 and the conductive pattern AD' may be electrically connected by the second bridge pattern BRP2. Therefore, the first power source ELVSS having the same level may be applied to the conductive pattern AD' and the fourth contact line CNL4.

As described above, the first power source ELVSS having the same level may be applied to the conductive pattern AD' and the dummy part DMP in the second peripheral region PPA2.

Hereinafter, a structure of the display device according to the still another embodiment of the present disclosure will be described along a stacking order with reference to FIGS. 18 and 19.

First, the first to eighth active patterns ACT1 to ACT8 (hereinafter, referred to as active patterns ACT) may be located on the substrate SUB. The active patterns ACT may be formed of a semiconductor material.

A gate insulating layer GI may be located on the substrate SUB on which the active patterns ACT are provided.

The second scan line S2$i$−1, S2$i$, and S2$i$+1, the light emitting control line E2$i$, the first to fourth extending lines ELP1, ELP2, ELP3, and ELP4, the first to seventh gate electrodes GE1 to GE7, and a lower electrode LE of a storage capacitor Cst may be located on the gate insulating layer GI.

A first insulating layer IL1 may be located on the substrate SUB on which the second scan line S2$i$−1, S2$i$, and S2$i$+1 and the like are provided.

An upper electrode UE of the storage capacitor Cst and the initialization power line IPL may be located on the first insulating layer IL1. The upper electrode UE may cover the lower electrode LE. The upper electrode UE above the lower electrode LE with the first insulating layer IL1 interposed therebetween may constitute the storage capacitor Cst.

A second insulating layer IL2 may be located on the substrate SUB on which the upper electrode UE and the like are provided.

The first and second data lines DL$k$ and DL$k$+1, the second power lines PL2$k$ and PL2$k$+1, an auxiliary connection line AUX, first to third contact lines CNL1, CNL2, and CNL3, the fourth contact line CNL4, and the first metal layer MTL1 may be located on the second insulating layer IL2. Here, the fourth contact line CNL4 may be connected to the eighth active pattern ACT8 through the fourteenth contact hole CH14 sequentially passing through the gate insulating layer GI and the first and second insulating layers IL1 and IL2.

The third insulating layer IL3 may be located on the substrate SUB on which the data lines DLk and DLk+1 and the like are provided.

A first bridge pattern BRP1, the second bridge pattern BRP2, and the second metal layer MTL2 may be located on the third insulating layer IL3. Here, the second bridge pattern BRP2 may be connected to the fourth contact line CNL4 through the fifteenth contact hole CH15. The second metal layer MTL2 may be connected to the first metal layer MTL1 through the twelfth contact hole CH12.

The protective layer PSV may be located on the substrate SUB on which the first bridge pattern BRP1 and the like are provided.

An anode electrode AD and the conductive pattern AD' may be located on the protective layer PSV. Here, the conductive pattern AD' may be connected to the second bridge pattern BRP2 through the sixteenth contact hole CH16. Also, the conductive pattern AD' may be connected to the second metal layer MTL2 through the thirteenth contact hole CH13. The conductive pattern AD' may be connected to the fourth contact line CNL4 through the second bridge pattern BRP2. As a result, the fourth contact line CNL4 and the second metal layer MTL2 may be electrically connected through the conductive pattern AD' and the second bridge pattern BRP2.

A pixel defining layer PDL defining the second pixel region PXA2 may be located on the substrate SUB on which the anode electrode AD and the conductive pattern AD' are provided.

An emitting layer EML may be provided in the second pixel region PXA2 surrounded by the pixel defining layer PDL, and a cathode electrode CD may be located on the emitting layer EML.

An encapsulation layer SLM covering the cathode electrode CD may be provided over the cathode electrode CD.

The display device according to the embodiment of the present disclosure can be employed in various electronic devices. For example, the display device is applicable to televisions, notebook computers, cellular phones, smart phones, smart pads, PMPs, PDAs, navigations, various wearable devices such as smart watches, and the like.

According to the present disclosure, the display device has two or more regions having different areas, and luminances in the respective regions can be uniform.

Further, according to the present disclosure, the reliability of the display device can be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth by the following claims and their functional equivalents.

What is claimed is:

1. A display device comprising:
   a substrate comprising:
   a first pixel region;
   a second pixel region connected to the first pixel region and having a smaller area than the first pixel region;
   a peripheral region surrounding the first pixel region and the second pixel region;
   a third pixel region spaced from the second pixel region and connected to the first pixel region; and
   a third peripheral region surrounding the third pixel region;
   a first pixel in the first pixel region and in a first row or column of pixels;
   a second pixel in the second pixel region and in a second row or column of pixels that is substantially parallel to the first row or column of pixels;
   a first line electrically connected to the first pixel;
   a second line electrically connected to the second pixel;
   an extending line extending to the peripheral region and connected to any one of the first line and the second line;
   a dummy part overlapping with the extending line, and for compensating a difference between a load value of the first line and a load value of the second line;
   a first power line in the peripheral region; and
   a conductive pattern overlapping with at least one region of the dummy part, and electrically connected to the first power line,
   wherein a number of pixels in the first row or column of pixels is greater than a number of pixels in the second row or column of pixels that is substantially parallel to the first row or column of pixels.

2. The display device of claim 1, wherein the dummy part comprises:
   an eighth active pattern on the substrate;
   an insulating layer over the eighth active pattern, and defining a fourteenth contact hole through which a portion of the eighth active pattern is exposed;
   the extending line on the insulating layer; and
   a fourth contact line above the extending line, connected to the eighth active pattern through the fourteenth contact hole, and connected to the conductive pattern.

3. The display device of claim 2, wherein a fixed first voltage is applied to the first power line, and a voltage having the same level as the fixed first voltage is applied to the conductive pattern and the fourth contact line.

4. The display device of claim 2, further comprising a protective layer defining:
   a fifteenth contact hole between the fourth contact line and the conductive pattern and exposing a portion of the fourth contact line therethrough; and
   a thirteenth contact hole exposing a portion of the first power line therethrough.

5. The display device of claim 4, wherein a first end of the conductive pattern is connected to the fourth contact line through the fifteenth contact hole, and
   wherein a second end of the conductive pattern is connected to the first power line through the thirteenth contact hole.

6. The display device of claim 2, wherein the first power line comprises:
   a first metal layer in the same layer as the fourth contact line; and
   a second metal layer on the first metal layer,
   wherein the display device further comprises an interlayer insulating layer defining:
   a twelfth contact hole between the first and second metal layers and exposing a portion of the first metal layer therethrough; and a fifteenth contact hole exposing a portion of the fourth contact line therethrough, and wherein the second metal layer is electrically connected to the first metal layer through the twelfth contact hole.

7. The display device of claim 6, further comprising:
a bridge pattern between the fourth contact line and the conductive pattern; and
a protective layer defining:
a sixteenth contact hole between the bridge pattern and the conductive pattern and exposing a portion of the bridge pattern therethrough; and
a thirteenth contact hole exposing a portion of the second metal layer therethrough.

8. The display device of claim 7, wherein a first end of the conductive pattern is connected to the bridge pattern through the sixteenth contact hole, and
wherein a second end of the conductive pattern is connected to the second metal layer through the thirteenth contact hole.

9. The display device of claim 8, wherein the sixteenth contact hole is in the protective layer to overlap with the fourteenth contact hole when viewed on a plane, and
wherein the thirteenth contact hole is in the protective layer to overlap with the twelfth contact hole when viewed on a plane.

10. The display device of claim 2, wherein the first line is a first scan line extending along a first direction on the substrate for providing a scan signal to the first pixel, and
wherein the second line is a second scan line extending along the first direction for providing a scan signal to the second pixel.

11. The display device of claim 10, wherein the second scan line extends to the peripheral region to be connected to the extending line.

12. The display device of claim 11, wherein the extending line is integrally formed with the second scan line.

13. The display device of claim 10, wherein a length of the first line is longer than that of the second line.

14. The display device of claim 10, further comprising:
a data line in the first pixel region and in the second pixel region, and extending along a second direction crossing the first direction on the substrate; and
a second power line spaced from the data line for receiving a fixed second voltage having a different level from a fixed first voltage.

15. The display device of claim 14, further comprising a third contact line between the dummy part and the second pixel in the peripheral region when viewed on a plane.

16. The display device of claim 15, wherein the third contact line extends from the second power line to be integrally formed with the second power line.

17. The display device of claim 16, wherein the third contact line and the dummy part are electrically separated from each other.

18. The display device of claim 14, wherein the second pixel comprises a transistor connected to the second scan line, the data line, and the second power line, the transistor comprising:
a seventh active pattern on the substrate;
a gate electrode on the seventh active pattern with a gate insulating layer interposed therebetween; and
source and drain electrodes each connected to the seventh active pattern.

19. The display device of claim 18, wherein the seventh active pattern is in the same layer as the eighth active pattern of the dummy part.

20. The display device of claim 18, further comprising a light emitting device connected to the transistor and comprising:
an anode electrode connected to the transistor;
an emitting layer on the anode electrode; and
a cathode electrode on the emitting layer.

21. The display device of claim 20, wherein the conductive pattern is in the same layer as the anode electrode.

22. The display device of claim 1, further comprising:
a first light emitting control line connected to the first pixel; and
a second light emitting control line connected to the second pixel.

23. The display device of claim 22, wherein the second light emitting control line extends to the peripheral region to be connected to the extending line.

24. The display device of claim 1, wherein the peripheral region comprises:
a first peripheral region at the periphery of the first pixel region;
a second peripheral region at the periphery of the second pixel region; and
an additional peripheral region adjacent the first pixel region and the second peripheral region.

25. The display device of claim 24, wherein the dummy part is in the second peripheral region.

26. The display device of claim 1, wherein the dummy part is in the third peripheral region.

27. The display device of claim 1, further comprising:
a third pixel in the third pixel region; and
a third scan line for providing a scan signal to the third pixel and connected to the extending line.

* * * * *